United States Patent
Ohayashi et al.

(10) Patent No.: US 7,476,915 B2
(45) Date of Patent: Jan. 13, 2009

(54) SEMICONDUCTOR INTEGRATED CIRCUIT INCLUDING A FIRST REGION AND A SECOND REGION

(75) Inventors: Masayuki Ohayashi, Ome (JP); Takashi Yokoi, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/040,127

(22) Filed: Feb. 29, 2008

(65) Prior Publication Data

US 2008/0157381 A1 Jul. 3, 2008

Related U.S. Application Data

(62) Division of application No. 11/520,622, filed on Sep. 14, 2006, now Pat. No. 7,365,376, which is a division of application No. 10/431,398, filed on May 8, 2003, now Pat. No. 7,119,383.

(30) Foreign Application Priority Data

May 9, 2002 (JP) ............................ 2002-133674

(51) Int. Cl.
*H01L 27/10* (2006.01)
*H01L 29/73* (2006.01)
(52) U.S. Cl. .................. 257/207; 257/208; 257/210; 257/E27.105; 257/E27.108
(58) Field of Classification Search ................ 257/207, 257/208, 210, E27.105, E27.108
See application file for complete search history.

(56) References Cited

U.S. PATENT DOCUMENTS

| | | | |
|---|---|---|---|
| 4,737,836 A | 4/1988 | Askin et al. | |
| 4,928,164 A | 5/1990 | Tanizawa | |
| 4,989,062 A | 1/1991 | Takahashi et al. | |
| 5,187,555 A | 2/1993 | Kuroda et al. | |
| 5,321,280 A | 6/1994 | Sakai | |
| 5,631,478 A | 5/1997 | Okumura | |
| 5,923,060 A | 7/1999 | Gheewala | |
| 6,222,213 B1 | 4/2001 | Fujiwara | |
| 6,339,234 B1 | 1/2002 | Takizawa | |
| 6,774,412 B2 | 8/2004 | Komaki | |
| 6,803,610 B2 | 10/2004 | Koolhaas et al. | |
| 6,927,429 B2 | 8/2005 | Chun et al. | |
| 2001/0054721 A1 | 12/2001 | Takayama | |
| 2003/0180670 A1* | 9/2003 | Hasegawa et al. | 430/494 |
| 2004/0067607 A1 | 4/2004 | Shin et al. | |

FOREIGN PATENT DOCUMENTS

JP 2000-3912 A 1/2000

* cited by examiner

*Primary Examiner*—Ngan Ngo
(74) *Attorney, Agent, or Firm*—Antonelli, Terry, Stout & Kraus, LLP.

(57) ABSTRACT

A semiconductor integrated circuit effectively makes use of wiring channels of wiring formed by a damascene method. When first cells are used, since the M1 power source lines are laid out at positions spaced away from a boundary between the cells, the power source lines are not combined in laying out a semiconductor integrated circuit. As a result, the width of the power source lines is not changed. Accordingly, an interval between the line and a line which is arranged close to the line, determined in response to a line width of the lines, can satisfy a design rule; and, hence, the reduction of the wiring channels can be obviated, whereby the supply rate of the wiring channels can be enhanced, and, further, the integrity of a semiconductor chip can be enhanced.

7 Claims, 17 Drawing Sheets

FIG. 17

| LINE SPACE | APPLICABLE LINE WIDTH |
|---|---|
| S | W≦Width≦W1 |
| S1 | W1<Width≦W2 |
| S2 | W2<Width≦W3 |
| S3 | W3<Width≦W4 |

WIDTH MEANS A LINE WIDTH
S MEANS A MINIMUM LINE SPACE
W MEANS A MINIMUM LINE WIDTH
P MEANS A REFERENCE LINE PITCH; P=S+W

W1=P×1+W; UPPER LIMIT OF LINE WIDTH OF FIRST LINE ZONE
W2=P×2+W; UPPER LIMIT OF LINE WIDTH OF SECOND LINE ZONE
W3=P×4+W; UPPER LIMIT OF LINE WIDTH OF THIRD LINE ZONE
W4=P×8+W; UPPER LIMIT OF LINE WIDTH OF FOURTH LINE ZONE

S1=P×1−W/2; LOWER LIMIT OF LINE WIDTH SPACE OF SECOND LINE ZONE
S2=P×2−W; LOWER LIMIT OF LINE WIDTH SPACE OF SECOND LINE ZONE
S3=P×3−W; LOWER LIMIT OF LINE WIDTH SPACE OF THIRD LINE ZONE

SEMICONDUCTOR INTEGRATED CIRCUIT INCLUDING A FIRST REGION AND A SECOND REGION

This is a divisional application of U.S. application Ser. No. 11/520,622, filed Sep. 14, 2006, which now U.S. Pat. No. 7,365,376, in turn, is a divisional application of U.S. application Ser. No. 10/431,398, filed May 8, 2003 (now U.S. Pat. No. 7,119,383), and the entire disclosures of which are hereby incorporated by reference.

BACKGROUND OF THE INVENTION

The present invention relates to a semiconductor integrated circuit (LSI) and a method of manufacture thereof; and, more particularly, the invention relates to a semiconductor integrated circuit in which there is an enhancement of the wiring density, as required by the next generation of development, in which a semiconductor integrated circuit has a miniaturized structure. For example, the present invention relates to a technique which is applicable in the formation of copper wiring by a damascene method in a semiconductor manufacturing process.

Recently, copper has been used as a wiring material for forming a semiconductor integrated circuit, since copper exhibits a low electrical resistivity, which is about ½ of the electrical resistivity of an aluminum alloy. The use of copper makes it possible to realize speed-up and miniaturization of a semiconductor integrated circuit. The copper wiring is typically formed by a damascene method, by which it is possible to overcome the problem that dry etching of copper is difficult, for example. The damascene method is a technique in which grooves are formed in an insulation film; a conductive film, such as a copper film, which constitutes a wiring material, is embedded in the grooves by plating, sputtering or the like; and, thereafter, the extra copper film outside the grooves is removed by chemical mechanical polishing (CMP), for example, so as to form conductive films in the grooves. A method which embeds a conductive film in wiring grooves and connection holes and forms wiring and plugs simultaneously is referred to as a dual damascene method, while a method which embeds a conductive film in wiring (or connection holes) and forms the wiring (or the plugs) is referred to as a single damascene method.

When the density of the wiring grooves or connection holes formed in the insulation film differs depending on the regions of a substrate where they are located, the quantity of the metal film to be removed by CMP differs between the dense regions and the coarse regions. For example, in the dense regions, a larger quantity of metal film is embedded in the wiring grooves or the wiring holes than is similarly embedded in the coarse regions; and, hence, the quantity of metal to be removed by CMP is increased in the dense regions, while the quantity of metal to be removed by CMP is decreased in the coarse regions. As a result, there arises a phenomenon in which the insulation film which remains between regions of the substrate differ in film thickness. This phenomenon is referred to as "erosion". Further, the metal film and the insulation film (for example, a silicon oxide film) largely differ in the polishing speed thereof when using the CMP method; and, hence, there arises a phenomenon in which the metal portions (portions such as wiring grooves or connection holes) are excessively polished. This phenomenon is referred to as "dishing". Japanese Unexamined Patent Publication 2000-3912 describes that it is necessary to hold the wiring occupying rate to equal to or less than a specific value to prevent such erosion or dishing.

For example, there is a design rule which indicates that a minimum line width is 0.2 μm and the minimum line interval is 0.2 μm; so that, when lines having the minimum width are arranged at the minimum line interval without gaps, the wiring occupying rate becomes 50%. However, in an actual LSI, there is no possibility that the lines will be arranged in such a perfect manner; and, hence, in actual manufacturing practice, the wiring occupying rate is not more than 30%, for example, in many cases.

However, to consider a case in which a width of the line is set to 0.4 μm, which is twice as large as the minimum line width, when lines having such a line width are arranged at the minimum line interval of 0.2 μm, the line occupying rate is increased to 67%. This line occupying rate is remarkably high compared to the average wiring occupying rate of 30%, and, hence, such an increase of the line width is not desirable from the viewpoint of prevention of erosion and dishing.

Here, in a case in which the line interval corresponding to these wide lines is set to 0.4 μm, the wiring occupying rate becomes 50% and approaches the average wiring occupying rate, and, hence, it is possible to obtain a preferable effect from the viewpoint of prevention of erosion and dishing.

Further, with respect to the wiring LSI of nowadays, an auto routing technique using DA (Design Automation) is usually used. Here, since the positions where lines can be arranged (wiring channels) are arranged by using a sum (basic pitch) of the minimum line width and the minimum line interval that is allowable as a reference based on a design rule, it is desirable to determine the line width and the line interval of the wide lines such that they conform to values which are an integer times as large as the basic pitch.

According to the latest miniaturized design rule, the difference between the locally high wiring occupying rate and the average wiring occupying rate, that is, an allowable wiring occupying rate, is becoming narrow. This tendency is particularly remarkable in the case of copper wiring using a damascene method. As a result, in the latest miniaturized design rule, the line width value which can be arranged with the minimum line width is becoming narrower compared to the conventional line width value.

SUMMARY OF THE INVENTION

The above-mentioned design (layout) of a semiconductor integrated circuit device can be performed by selectively arranging cells, which are preliminary laid out at a work station or the like and are stored as a library. Each cell includes power source lines and signal lines. The power source lines are, for example, arranged at a peripheral portion of the cell in the vertical direction (in the direction orthogonal to the extending direction of the power source lines) and the line width thereof is usually set to be wider than the line width of the signal lines. Wiring channels are arranged between a pair of power source lines (Vdd, Vss) of the cell. The above-mentioned power source lines are configured such that, when a plurality of cells are arranged, the power source lines of the neighboring cells in the vertical direction are connected to each other, and the line width of the lines in the vertical direction is widened so as to reduce the resistance of the power source lines. Accordingly, in a case in which a design rule is set such that the greater the line width of the lines, the wider will be the line interval between the line and another line which is arranged close to the line in the vertical direction, although the design rule is satisfied when the single cell is laid out, at the time of laying out a semiconductor integrated circuit using the cells, the zone of the line width of the power source lines is increased, so that the design rule is not satisfied. Accordingly, in laying out the semiconductor integrated circuit, when the line width is increased by connecting the power source lines in the neighboring cells that are arranged in the vertical direction, the interval between a line and another line which is arranged close to the line in the vertical direction is widened. Accordingly, the wiring channels which are closest to the power source lines in the vertical direction cannot be used. As a result, the supply rate of the wiring channels is lowered, and it has been originally found by the inventors of the present invention that the use of the wiring channels, which constitute an upper layer, obstructs the enhancement of the integration of the semiconductor chip.

Further, as mentioned previously, with respect to the power source lines, when a plurality of cells are arranged, the power source lines of the neighboring cells in the vertical direction are connected to each other, and, hence, the line width of the power source lines is changed. Accordingly, although the design rule is satisfied when a single cell is laid out, there is a possibility that, at the time of laying out the semiconductor integrated circuit using plural cells, the zone of the line width of the power source lines is increased, so that the design rule is not satisfied. For example, the inventors of the present invention have found that, when a design rule is set such that when the line width of the lines is increased, the line interval between a line and another line arranged close to the line is widened in the vertical direction, although the design rule is satisfied when a single cell is laid out, there is a possibility that the design rule will not be satisfied at the time of laying out a semiconductor integrated circuit using plural cells. That is, in spite of the fact that the power source lines that are arranged close to each other in the vertical direction are connected to each other so that the line width section is increased due to an increase of the line width of the power source lines, since the interval between lines in the cell is fixed, the design rule is not satisfied in this case.

Accordingly, it is an object of the present invention to provide a technique which can more effectively make use of wiring channels.

It is another object of the present invention to provide a technique which can obviate the creation of a design rule error at the time of forming cells.

The above-mentioned and other objects and novel features of the present invention will become more apparent from the following description and the attached drawings.

To present a summary of typical aspects of the invention disclosed in this specification, the following examples are set forth.

That is, according to a first aspect of the present invention, in a semiconductor integrated circuit in which a plurality of cells having respectively given functions are arranged, lines which are arranged in peripheral portions of the cells are laid out at positions spaced away from a boundary between cells which are arranged close to each other.

In such a case, the lines which are arranged in peripheral portions of the cells are laid out at positions spaced away from the boundary between cells which are arranged close to each other; and, hence, a possibility that the line width is widened due to coupling of wide-width lines in the cells arranged close to each other is eliminated. When the interval between a wide-width line and a line which is disposed close to the wide-width line is widened corresponding to a line width of the wide-width line, due to the design rule, there is a possibility that the number of wiring channels is reduced. However, by adopting a layout in which the lines arranged at the peripheral portions of the cells are disposed at positions spaced away from the boundary between the cells which are arranged close to each other, it is possible to prevent the line width of the wide-width line from being widened; and, hence, it is unnecessary to reduce the number of wiring channels. Accordingly, the availability rate of the wiring channels is increased.

Further, according to a second aspect of the present invention, in a semiconductor integrated circuit in which a plurality of cells having respectively given functions are arranged, the cell includes wide-width lines that are arranged at the peripheral portion and narrow-width lines having a line width narrower than a line width of the wide-width lines, and the line interval between a wide-width line and a narrow-width line which is arranged close to the wide-width line is set to be wider than the minimum arrangement pitch of the narrow-width lines. Here, it is possible to set the ratio between the width of the wide-width line and the width of the narrow-width line to a value equal to or more than 1:2.

In such a constitution, the line interval between a wide-width line and a narrow-width line, which is arranged close to the wide-width line, is set to be wider than the minimum arrangement pitch of the narrow-width lines. That is, the line interval is widened corresponding to the line width of the wide-width lines. Accordingly, it is possible to prevent the occurrence of an undesired increase of the wiring occupying rate, so that erosion and dishing can be prevented, whereby the semiconductor integrated circuit can exhibit favorable properties.

According to a third aspect of the present invention, in a semiconductor integrated circuit which is formed on one semiconductor substrate such that the semiconductor integrated circuit includes a first region and a second region which is different from the first region, a plurality of first cells having respectively given functions are arranged in the first region, lines which are arranged on a peripheral portion are arranged at positions spaced away from boundaries of the first cells, which are arranged close to each other in accordance with a layout, a plurality of second cells having respectively given functions are arranged in the second region, the second cell includes wide-width lines arranged on the peripheral portion and narrow-width lines having a line width narrower than the line width of the wide-width lines, and a line interval between the wide-width line and the narrow-width line which is arranged close to the wide-width line is set to be wider than the minimum arrangement pitch of the narrow-width lines.

In such a constitution, when the semiconductor integrated circuit includes a first region and a second region which differs from the first region, the first cells and the second cells can be used corresponding to the respective regions.

In the above-mentioned semiconductor integrated circuit, the first cell includes a bridging portion which is capable of bridging between the neighboring wide-width lines of the first cell and other first cells disposed close to the first cell, and by making use of a fact that the probability that the arranged cells are simultaneously operated is not 100%, when one cell is not operated, a power source line of one cell is operated as if the power source line is a power source line of another cell, whereby the effective allowable current value can be increased.

Further, according to a third aspect of the present invention, in a method of manufacture of a semiconductor integrated circuit, which includes a first step of laying out the semiconductor integrated circuit using cells and a second step of laying out a semiconductor integrated circuit based on layout information of the semiconductor integrated circuit, lines arranged in peripheral portions of the cells are laid out at positions spaced away from the peripheries of the cells.

Due to such a constitution, the lines in the peripheral portions of the cells can be laid out at positions spaced away from the boundaries of the cells which are arranged close to each other, it is possible to obviate an increase of the line width caused by coupling of the wide-width lines of the cells that are arranged close to each other. When the wide-width lines of the neighboring cells are coupled and the line width is increased eventually, the lines of the peripheral portions and the wiring channels which are arranged close to the lines cannot be used as auto routing channels due to the violation of the wiring interval rule. On the contrary, in this case, by arranging the lines of the peripheral portions of the cells at positions spaced away from the boundaries of the cells which are arranged close to each other, the line width of the wide-width lines cannot be widened. Accordingly, it is possible to obviate a situation in which the lines of the peripheral portions and the wiring channels arranged close to the lines cannot be used as auto routing channels, due to the violation of wiring interval rule, whereby it is possible to effectively utilize the wiring channels.

Further, according to a fourth aspect of the present invention, the width of power source lines arranged at the peripheral portions of the cells is preliminarily set to a large width, such that the width of the power source lines is equivalent to a zone of the combined width of the power source line formed by arranging a plurality of cells close to each other in the first step. According to the layout which uses such cells, by setting the width of wide-width lines that are arranged at the peripheral portions of the cells to a width that is equivalent to the zone of the width of the power source lines, which are combined by arranging a plurality of cells close to each other in the first step, the use of wiring channels that are arranged close to the power source lines as lines is prohibited at the stage of the cells. Accordingly, it is possible to set an interval between the power source line and the narrow-width line which is arranged close to the power source line that is wider than the minimum arrangement pitch of the narrow-width lines. Since the interval between a power source line and a narrow-width line which is arranged close to the power source line is set to be wider than the minimum arrangement pitch of the narrow-width lines, it is possible to make the distance between the power source line and the narrow-width line, which is arranged close to the power source line, conform to the wiring rule when they are laid out on the semiconductor integrated circuit at the stage of cells, whereby the violation of the design rule which may be revealed for the first time at the time of laying out the semiconductor integrated circuit can be obviated at the stage of forming the cells.

According to another aspect of the present invention, there is provided a method of manufacture of a semiconductor integrated circuit, including a first step of laying out the semiconductor integrated circuit using cells and a second step of forming the semiconductor integrated circuit based on layout information of the semiconductor integrated circuit, wherein the cell includes first cells, in each of which a line in a peripheral portion of the cell is laid out at a position spaced away from a periphery of the basic cell, and second cells in each of which the width of a wide-width line arranged at the cell is set to a value equivalent to a zone of width of a power source line, which is formed by combination by arranging a plurality of cells close to each other.

Further, the above-mentioned second step may include a metal line forming treatment in which groove forming is applied to an insulation film, a wiring material is embedded into the grooves, and, thereafter, extra thin film outside the grooves is removed, thus forming lines by the damascene method.

BRIEF DESCRIPTION OF THE DRAWINGS

FIG. 17 is a table showing the relationship between a line space and an applicable line width when the second cells are used.

DETAILED DESCRIPTION OF THE PREFERRED EMBODIMENT

Figure 1:
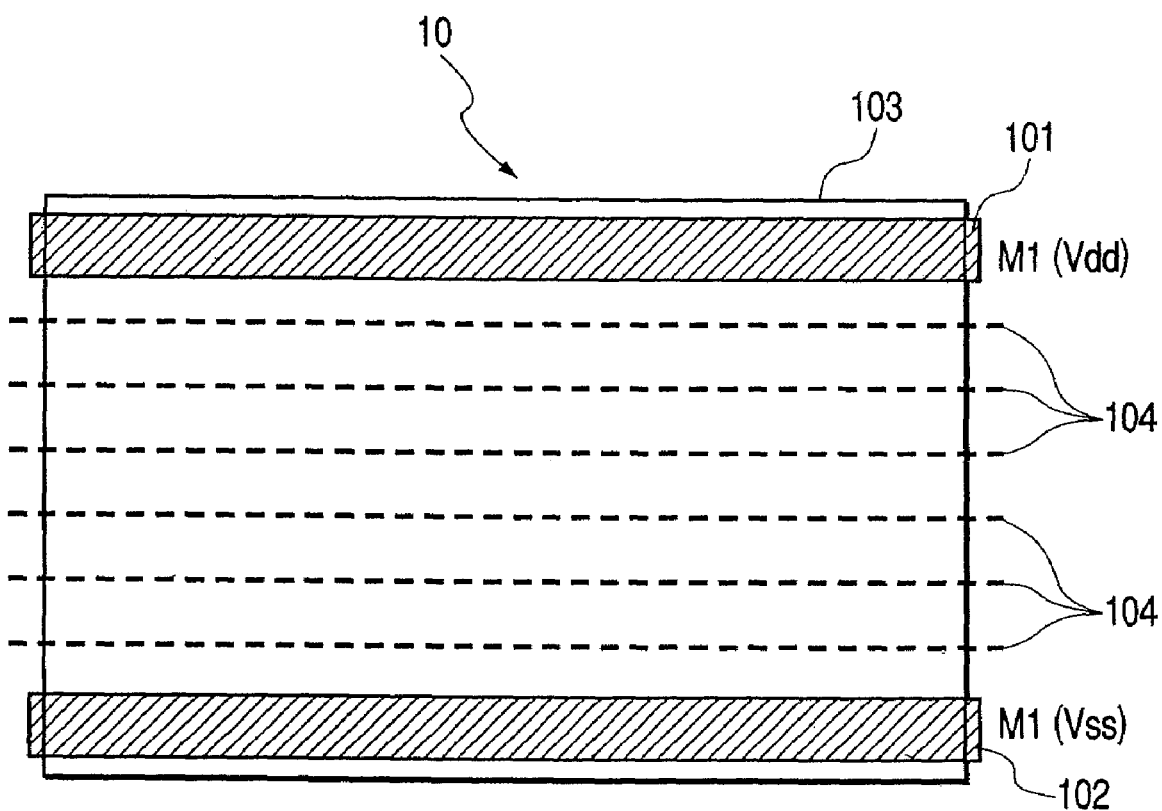
FIG. 1 is a diagrammatic plan view showing an example of the constitution of first cells used in the layout of a semiconductor integrated circuit according to the present invention.

A semiconductor integrated circuit (LSI) manufactured by the damascene method according to the present invention is constituted, for example, of a desired circuit, such as a logic circuit, which is formed by arranging cells (also referred to as "basic cells" or "unit cells") corresponding to logic gates, such as inverter circuits (INV), NAND circuits (NAND), flip-flop circuits (FF), NOR circuits (NOR) or the like, on a semiconductor chip in a matrix array. That is, the cells are formed on the chip, and cells are connected to each other by lines so as to form a desired circuit. With respect to a power source (Vdd) and a ground line (Vss), any one of these cells is preliminarily set to satisfy the needed electrical characteristics. In this manner, by merely generating a master pattern relating to the wiring, it is possible to form various kinds of LSIs.

A process of manufacture of an LSI includes a first step in which a layout of the semiconductor integrated circuit is performed using the cells and a second step in which the semiconductor integrated circuit is formed based on layout information of the semiconductor integrated circuit. In the first step, using a computer system, such as a work station (not shown in the drawing), a layout tool, such as a layout editor, is operated. The cells corresponding to the logic gates, such as the inverter circuits (INV), the AND circuits, the NOR circuits or the like, are prepared as a library.

The second step includes, for example, a patterning step in which etching is performed using a mask to effect a photolithography technique based on the layout information, a step in which ion implantation of impurities is performed using a mask, a step in which a conductive film is formed by stacking, a chemical mechanical polishing step and the like.

FIG. 1 shows the essential constitution of the first cell used in the layout of the semiconductor integrated circuit.

The size of the first cell 10 (hereinafter simply referred to as "cell 10") is determined by a quadrangular-shaped frame 103. Numeral 101 indicates a high-potential-side (Vdd) power source line, numeral 102 indicates a low-potential-side (Vss) power source line, numeral 104 indicates channel positions (also referred to as "wiring channels" or "channels") which can be used in auto routing on a first metal line (M1) layer. The first cell 10 is configured such that terminals of the cell are arranged on the usable channel positions 104 and the auto routing can be performed after auto placement of the first cell 10 in the work station. When the cell 10 is arranged or placed in the work station, lines are arranged on the usable wiring channel positions 104 and the terminals of the cells 10 are connected by lines. Here, other lines which connect terminals of other cells may pass over these channel positions 104 of the cell 10.

Here, in the cell 10 shown in FIG. 1, the high-potential-side power source lines 101 and the low-potential-side power source lines 102, which constitute lines on the peripheral portions of the cell 10, are arranged along the peripheries of the cell 10. That is, these power source lines 101, 102 are arranged at positions spaced away from the peripheries of the cell 10 by the minimum arrangement pitch of the narrow width lines. Here, the narrow width lines are lines having a width narrower than the width of the power source lines, and they usually correspond to the signal lines, and the minimum arrangement pitch corresponds to the wiring channel positions 104. The channel positions 104 are used at the time of the laying out (auto placement and routing) of the semiconductor integrated circuit in the first step. That is, the channel positions 104 are not formed as physical structures in the manufactured semiconductor integrated circuit device.

Figure 4:
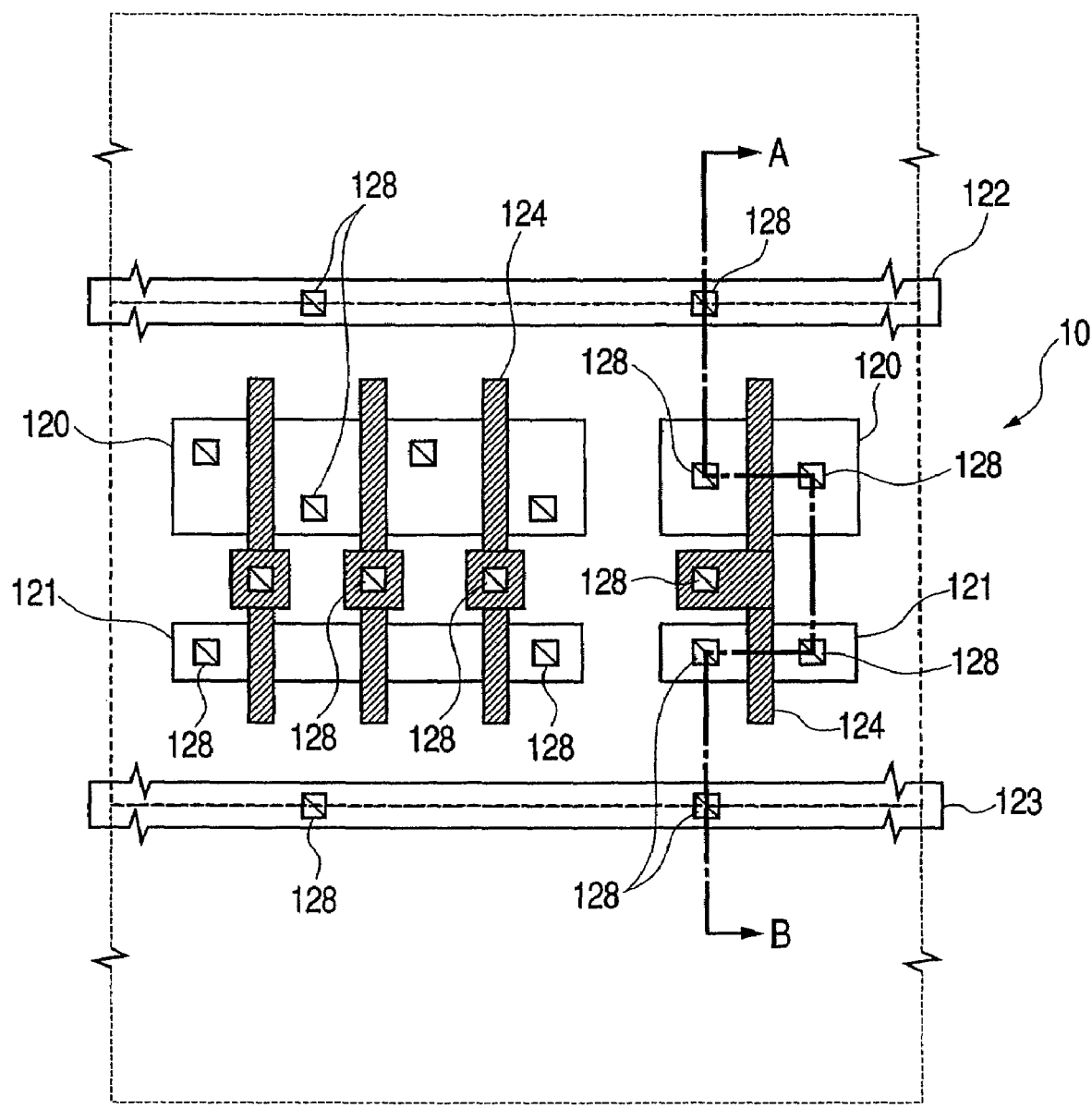
FIG. 4 is a diagram showing an example of the constitution of a first cell.

FIG. 4 shows an example of the arrangement of diffusion layers (semiconductor regions), gate electrodes, and the contact holes in the above-mentioned cell 10.

Numeral 120 indicates the diffusion layers which constitute source/drain regions of a p-channel type MOS transistor, which are formed in n-type well regions. Numeral 121 indicates the diffusion layers which constitute source/drain regions of an n-channel type MOS transistor, which are formed in p-type well regions. Numeral 122 indicates an n-type well power-supply diffusion layer of the p-channel type MOS transistor 120, and it is formed such that the diffusion layer 122 extends in the extending direction of the power source lines 101, 102 for reducing the resistance of the n-type well regions. Numeral 123 indicates a p-type well power-supply diffusion layer of the n-channel type MOS transistor 121, and it is formed such that the diffusion layer 123 extends in the extending direction of the power source lines 101, 102 for reducing the resistance of the p-type well region. Numeral 128 indicates contact holes (connection holes) for connecting the diffusion layers, the gate electrode 124 of the MOS transistor and a metal line (MO), which constitutes an upper layer. A gate electrode 124 of the MOS transistor is formed on the well region by way of a gate insulation film (not shown in the drawing). Here, the gate electrode 124 of the p-channel type MOS transistor 120 and the gate electrode 124 of the n-channel type MOS transistor 121 are integrally formed. Further, on the diffusion layers 120, 121, 122 and 123, silicide layers, for example, are respectively formed for reducing the resistance, while plugs are formed in the contact holes, for example.

Figure 5:
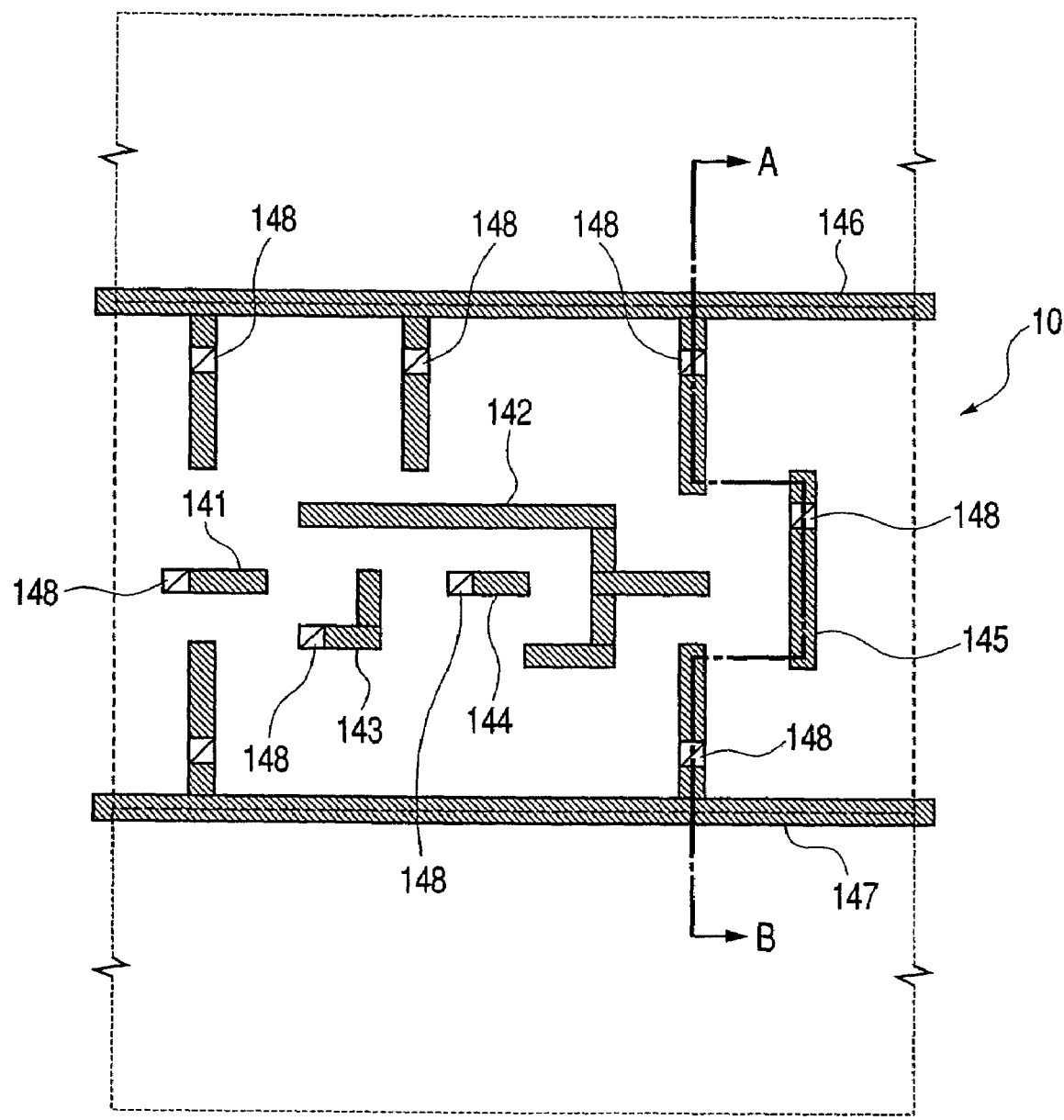
FIG. 5 is a diagram showing an example of the constitution of the first cell.

FIG. 5 shows an example of the arrangement of the inner wiring layers and through holes (connection holes) in the above-mentioned cell 10. The inner wiring layers are formed of metal lines (M0) made of tungsten (W) or copper (Cu), for example, which are manufactured by the damascene method. Plugs made of tungsten (W), copper (Cu) or the like are formed inside the through holes (connection holes) and are manufactured by the damascene method. The plugs are formed inside the through holes.

Numerals 141 to 145 indicate cell inside-connection wiring layers of the MOS transistor; numerals 146 and 147 indicate cell inner wiring layers for power source connection of the MOS transistor; and numeral 148 indicates a through hole for cell inside-connection wiring layers of the MOS transistor. The wiring layers (M0, M1), which constitute different layers, are connected to each other via the through holes.

Figure 6:
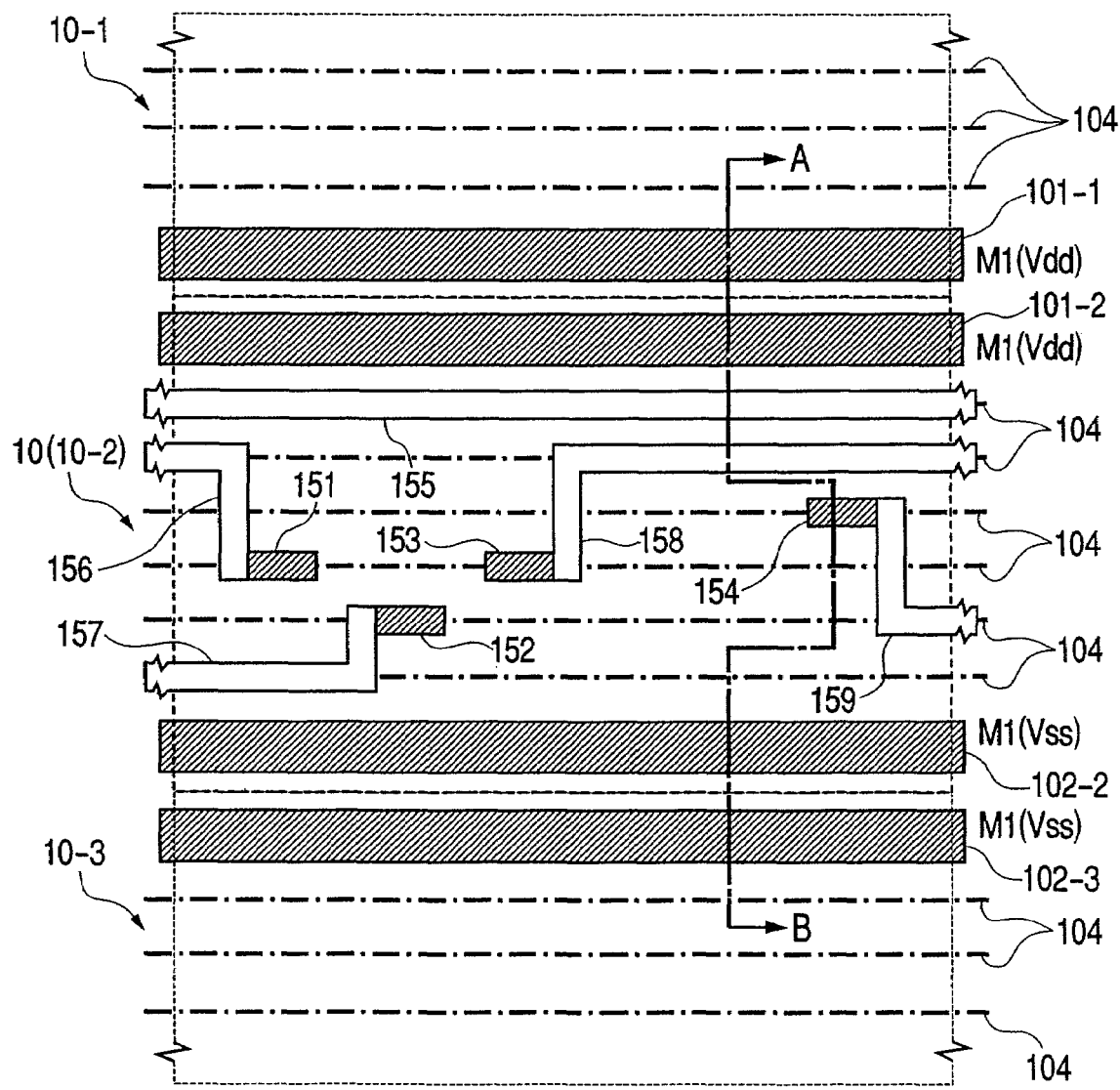
FIG. 6 is a diagram showing an example of the constitution of the first cell.

In FIG. 6, terminal layers in the cell 10, which are constituted of the first metal (M1) wiring layers, wiring layers which are connected to the terminal layers, and the lines and power-source wiring layers which pass above the cell are illustrated. The terminal layers, the wiring layers, the lines, and the power source wiring layers are made of a metal material, such as tungsten (W) or copper (Cu), and they are manufactured by the damascene method. Here, the terminal layers, the wiring layers, the lines and plugs in the through holes may be manufactured by the dual damascene method.

Numerals 151 to 154 indicate first metal (M1) line terminal layers; numeral 155 indicates a M1 wiring layer; numeral 156 to 159 indicate M1 wiring layers, which are connected to terminal of the cells; numerals 101-2 (Vdd) and 101-2 (Vss) indicate M1 power source wiring layers (Vdd, Vss) of the cell 10; and numerals 101-1 (Vdd) and 102-3 (Vss) indicate M1 power source wiring layers of the cells 10-1, 10-3, which are arranged close to each other in the vertical direction (direction orthogonal to the extending direction of the power source wiring layers).

Numeral 104 indicates the wiring channels (channel positions), which are formed between the M1 power source wiring layers 101-2, 102-2 of the cell 10-2. The M1 line terminal layer, the M1 wiring layer which passes over the cell and the M1 wiring layer which is connected to the terminal of the cell are arranged above the wiring channels 104 that are disposed between the M1 power source wiring layers 101-2, 102-2 of the cell 10, and they are connected to another cell arranged remotely in the left-and-right direction (extending direction of the power source wiring layer) of the cell 10-2 (10) by way of the M1 terminal layer, the M1 wiring layer and the M1 line; or, alternatively, they are connected to another cell that is arranged remotely in the up-and-down direction, as well as in the left-and-right direction, of the cell 10-2 (10) by way of the M1 wiring layer and the M1 line. In this manner, the M1 terminal layer, the M2 wiring layer and the M2 line constitute inter-cell lines, which electrically connect cells that are configured to be spaced apart from each other in the up-and-down direction, as well as in the left-and-right direction.

Figure 7:
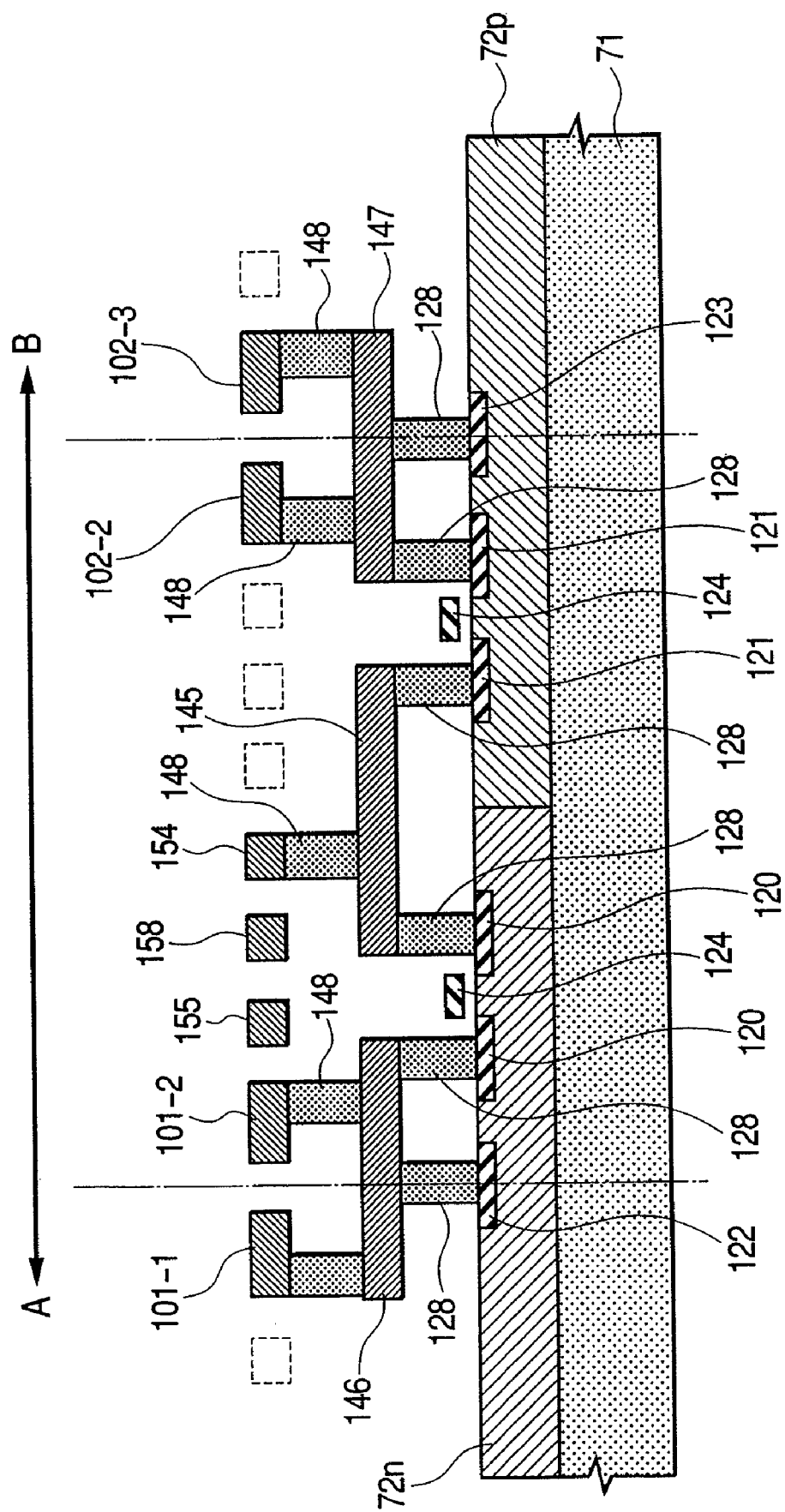
FIG. 7 is a cross-sectional view as seen along line A-B in FIGS. 4, 5 and 6.

FIG. 7 shows a cross section of the cell 10. This cross section corresponds to a line segment A-B in FIG. 4, FIG. 5 and FIG. 6.

On a silicon substrate 71, an n-type well region 72n and a p-type well region 72p are formed. On the p-type well region 72p, the p-type diffusion layer 120, which constitutes the source/drain region of the p-channel type MOS transistor, the n-type diffusion layer 121, which constitutes a source/drain region of the n-channel type MOS transistor, the n-type well power-supply diffusion layer 122 of the p-channel type MOS transistor, and the p-type well power-supply diffusion layer 123 of the n-channel type MOS transistor are formed. Further, as will be explained later in conjunction with FIG. 18, interlayer insulation films 501, 502, which are formed of silicon oxide films or the like, are formed such that these films 501, 502 cover the diffusion layers 120 to 123. In these interlayer insulation films 501, 502, the cell inside-connection wiring layers 141 to 147 of the MOS transistor and the through holes (plugs) 128 are formed. These components are manufactured by the damascene method, for example. Then, interlayer insulation films 503, 504, which are formed of silicon oxide films or the like, are formed such that these films 503, 504 cover the cell inside-connection wiring layers 141 to 147 of the MOS transistor. In the interlayer insulation films 503, 504, the M1 power source wiring layers 101-1, 101-2, 102-2, 102-3, the terminal layers, the wiring layers and lines 151 to 159 are formed. These components are manufactured by the damascene method, for example.

Figure 18:
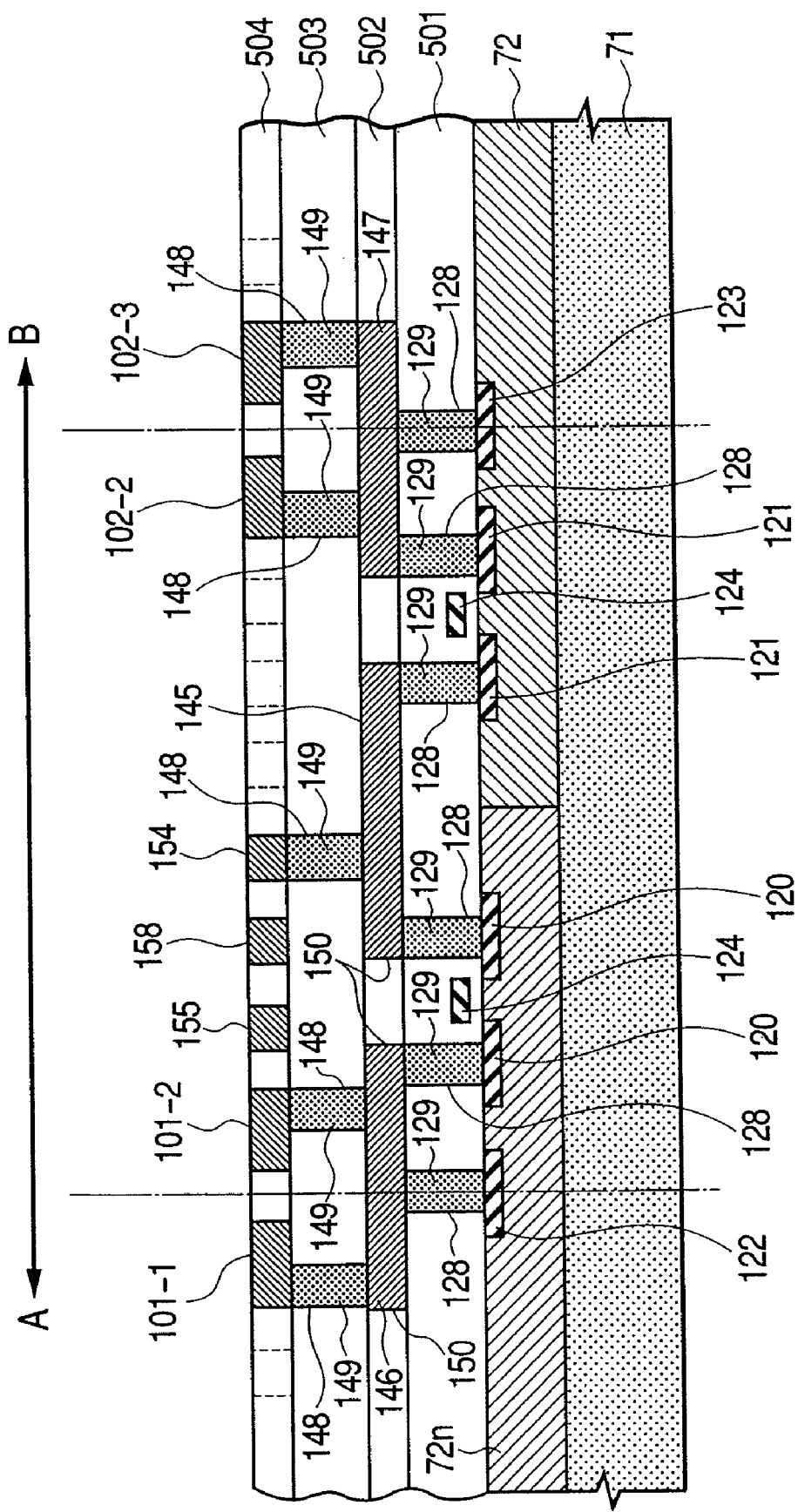
FIG. 18 is a cross-sectional view as seen along line A-B in FIGS. 4, 5 and 6, when the semiconductor integrated circuit corresponding to FIG. 7 is manufactured using a damascene method.

Next, the steps carried out in forming the semiconductor integrated circuit will be explained in conjunction with FIG. 18.

The cell inside-connection wiring layers 145, the cell inner wiring layers 146, 147 for power source connection, and the M1 power source wiring layers 101-1, 101-2, 102-2, 102-3 are formed using the damascene method, for example. The interlayer insulation film 501 is formed such that the interlayer insulation film 501 covers the gate electrode 124 of the MOS transistor, the diffusion layers 120, 121 of the MOS transistor, and the well power-supply diffusion layers 122, 123 of the MOS transistor. The interlayer insulation film 501 is formed such that, for example, the oxide silicon film 501 is stacked by the CVD (Chemical Vapor Deposition) method; and, thereafter, the surface of the silicon oxide film 501 is polished by chemical mechanical polishing (CMP) so that the surface is leveled.

Subsequently, a photo resist film (not shown in the drawing and simply referred to as "resist film" hereinafter) is formed on a silicon oxide film 501, for example, and the contact holes 128 are formed in the gate electrode 124 of the MOS transistor, the diffusion layers 120, 121 of the MOS transistor and the well power-supply diffusion layers 122, 123 of the MOS transistor by etching the oxide silicon film 501, using the resist film as a mask.

Then, on the silicon oxide film 501, including the inside of the contact holes 128, for example, a thin titanium nitride (TiN) film is formed as a barrier metal layer by the CVD method or the sputtering method; and, thereafter, for example, a tungsten (W) film is stacked on the titanium nitride film to serve as a conductive film by the CVD method. Then, a TiN film and a W film outside the contact holes 128 are removed by the CMP method, for example, so as to form the plugs 129.

Subsequently, on the interlayer insulation film 501 and the plugs 129, the interlayer insulation film 502 is stacked by the CVD method, for example. Thereafter, the interlayer insulation film 502 is leveled by the CMP method. Then, a resist film is formed on the interlayer insulation film 502, and wiring grooves 150 are formed by etching the silicon oxide film 502, using this resist film as a mask.

Then, on the interlayer insulation film 502, including the inside of the wiring grooves 150, for example, a thin TiN film is formed as a barrier metal layer by the CVD method or the sputtering method; and, thereafter, for example, a W film is stacked on the TiN film to serve as a conductive film by the CVD method.

Then, a TiN film and a W film outside the wiring grooves 150 are removed by the CMP method, for example, so as to form the cell inside-connection wiring layer 145 and the cell inside wiring layers 146, 147 for power source connection, which are electrically connected with the plugs 129.

Subsequently, the interlayer insulation film 503 is formed on the interlayer insulation film 502, the cell inside-connection wiring layer 145 and the cell inside wiring layers 146, 147 for power source connection by the CVD method, for example. Then, using steps similar to the steps for forming the plugs 129, plugs 149, which are electrically connected with the cell inside wiring layer 145 and the cell inside-connection wiring layers 146, 147 for power source connection are formed on the interlayer insulation film 503.

Then, the interlayer insulation film 504 is formed on the interlayer insulation film 503 and the plugs 149 by the CVD method, for example. Thereafter, using steps similar to the steps for forming the cell inside-connection wiring layer 145 and the cell inside wiring layers 146, 147 for power source connection, the M1 power source wiring layers 101-1, 101-2, 102-2, 102-03, which are electrically connected to the plugs 149, are formed on the interlayer insulation film 504.

Although a process for forming the wiring layers and the plugs using the damascene method has been explained heretofore, these wiring layers and plugs also may be formed using the dual damascene method.

That is, the interlayer insulation films 501, 502 are stacked and the contact holes 128 and the wiring grooves 150 are formed using the resist film as a mask. Thereafter, the barrier metal layers and the conductive film are embedded into the inside of the contact holes 128 and the wiring grooves 150, so that the plugs 129, the cell inside-connection wiring layers 145 and the cell inside wiring layers 146, 147 for power source connection may be formed.

In the same manner, after forming the interlayer insulation films 503, 504, the plugs 149 and the M1 power source wiring layers 101-1, 101-2, 102-2, 102-3 may be formed by the dual damascene method.

Further, although these wiring layers and the conductive films of the plugs are formed of tungsten (W), they may be formed of films having copper (Cu) as the main component. When a Cu film is used, the barrier metal layer is formed of a film made of Ti, Ta, TaN besides TiN or is formed of a laminated film constituted of these films.

Figure 8:
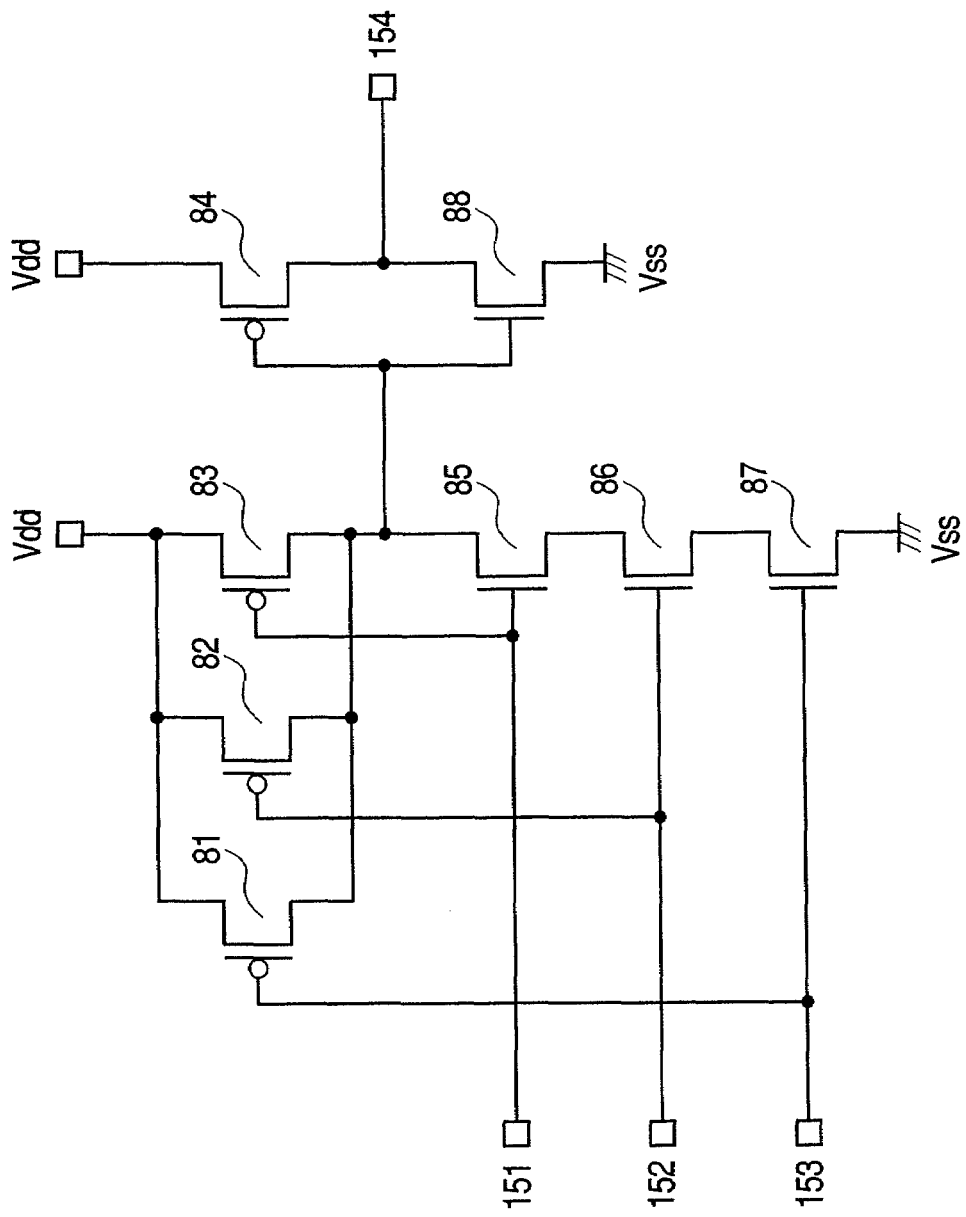
FIG. 8 is a schematic circuit diagram showing the circuit constitution of the first cell.

FIG. 8 illustrates the circuit constitution of the cell 10 shown in FIG. 4, FIG. 5 and FIG. 6.

As shown in FIG. 8, although there is no particular restriction on the cell 10, the cell 10 is constituted of four p-channel type MOS transistors 81 to 84 and four n-channel type MOS transistors 85 to 88. By combining these components, a three inputting NAND gate and an inverter are formed. That is, due to the combination of the p-channel type MOS transistors 81 to 83 and the n-channel type MOS transistors 85 to 87, a NAND gate is formed which operates according to NAND logic by fetching signals from the terminals 151 to 153, while due to the combination of the p-channel type MOS transistor 84 and the n-channel type MOS transistor 88, an inverter is formed which inverts the logic of output signals of the above-mentioned three inputting NAND gates. The output signal of the inverter is supplied through the terminal 154.

Figure 2:
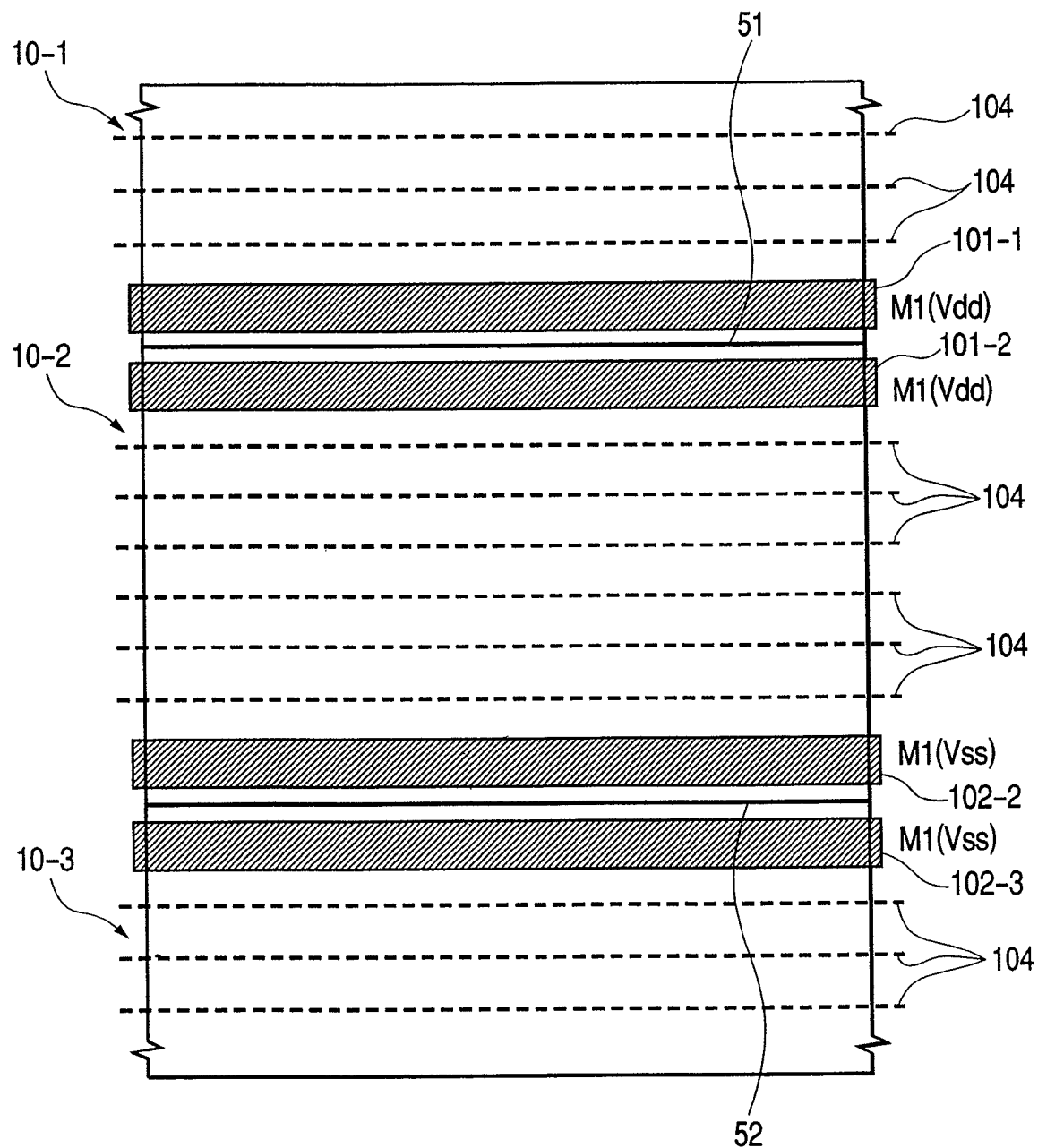
FIG. 2 is a diagrammatic plan view showing an arrangement of the first cells.

FIG. 2 shows a state in which, in the layout of the semiconductor integrated circuit, in the vertical direction of a cell 10-2 that is constituted in the same manner as the cell 10 shown in FIG. 1 (direction orthogonal to the extension direction of the power source wiring layers), cells 10-1, 10-3 are arranged, which are constituted in the same manner as the cell 10. In FIG. 2, some channels 104 and portions of lines are omitted from the cells 10-1 and 10-3.

Figure 3:
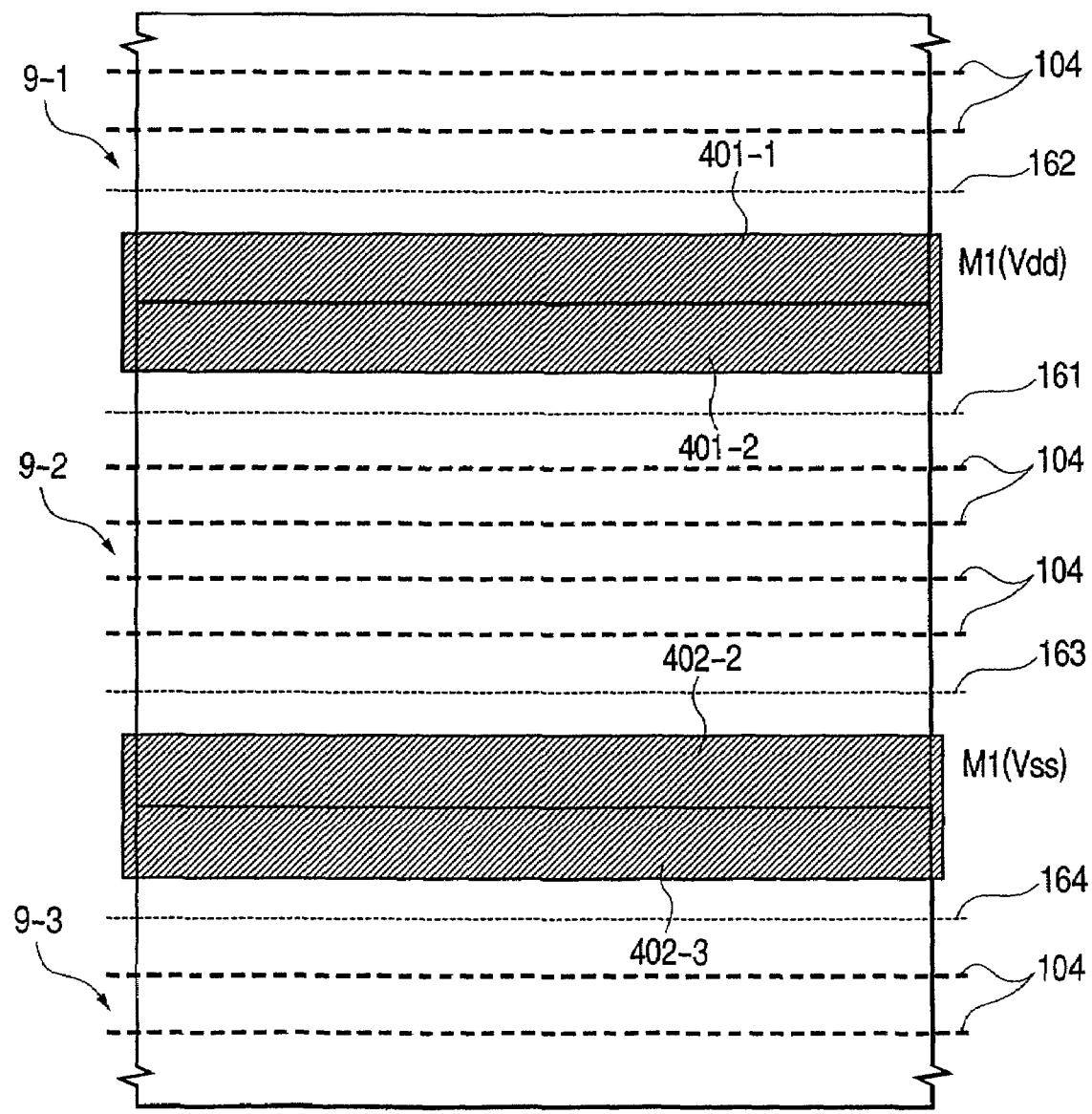
FIG. 3 is a diagrammatic plan view showing an arrangement of the cells which constitute an object to be compared with the first cells.

As shown in FIG. 2, when the cells 10-1, 10-2 and 10-3 are arranged close to each other in the vertical direction, the high-potential-side power source lines M1 (Vdd) and the low-potential-side power source lines M1 (Vss) are laid out such that they are positioned so as to be spaced vertically away from the boundaries of the cells. That is, in the cells 10-1, 10-2 and 10-3, the high-potential-side power source lines M1 (Vdd) and the low-potential-side power source lines M1 (Vss) in the cells 10-1, 10-2, 10-3, which constitute lines at the peripheral portions of the cells, are arranged at positions which are spaced away from the peripheries of the cells in the vertical direction; and, hence, when these cells are arranged close to each other in the vertical direction, as shown in FIG. 2, the M1 power source lines are laid out at positions which are spaced away from the corresponding cell boundaries 51, 52 in the vertical direction. Accordingly, in laying out the semiconductor integrated circuit, the power source lines are not combined between the cells 10-1 and 10-2, as well as between the cells 10-2 and 10-3. For example, when the power source lines are arranged in a state such that they are not spaced away from the peripheries of the cells, as illustrated in FIG. 3, the power source lines are combined between cells 9-1 and 9-2, as well as between cells 9-2 and 9-3, which are arranged close to each other in the vertical direction. That is, a power source line 401 is formed by combining the power source line 401-1 of the cell 9-1 and the power source line 401-2 of the cell 9-2, which is arranged close to the cell 9-1, while a power source line 402 is formed by combining the power source line 402-2 of the cell 9-2 and the power source line 402-3 of the cell 9-3, which is arranged close to the cell 9-2.

In this manner, since the power source lines of the cells which are arranged close to each other in the vertical direction are combined with each other, the line width of the power source line becomes twice as large as the width of the line of a single cell. When a rule is set with respect to an interval between a line and another line arranged close to the line in accordance with the line width of the lines, the line interval is widened in accordance with the rule; and, hence, there is a possibility that, out of the wiring channels 104, the channels indicated by numerals 161, 162, 163, 164 cannot be used as lines. When these wiring channels cannot be used as lines, the supply rate of the wiring channels in the first metal (M1) line is lowered, and this obstructs the enhancement of the integration of the semiconductor chip.

To the other hand, when the cells shown in FIG. 1 are used, since the power source lines M1 are laid out at positions that are spaced away from the boundaries of the cells, in laying out the semiconductor integrated circuit, combination or joining of the power source lines among the cells 10-1, 10-2, 10-3 shown in FIG. 2 does not occur. As a result, the width of the power source lines is not changed. Accordingly, the design rule can be satisfied with respect to the interval between a line and another line which is arranged close to the line in accordance with the line width of the line; and, hence, it is possible to prevent the reduction of the wiring channels, whereby it is possible to achieve an enhancement of the supply rate of the wiring channels and also an enhancement of the integration of the semiconductor chip. That is, a reduction of the number of wiring channels attributed to a design rule violation and a reduction of the integration based on a reduction of the number of wiring channels, which are revealed first of all in the layout of the semiconductor integrated circuit, can be obviated at the time of forming the first cells in advance.

Here, a specific example of the line width shown in the above-mentioned cell 10 will be explained in conjunction with FIG. 15.

Figure 15:
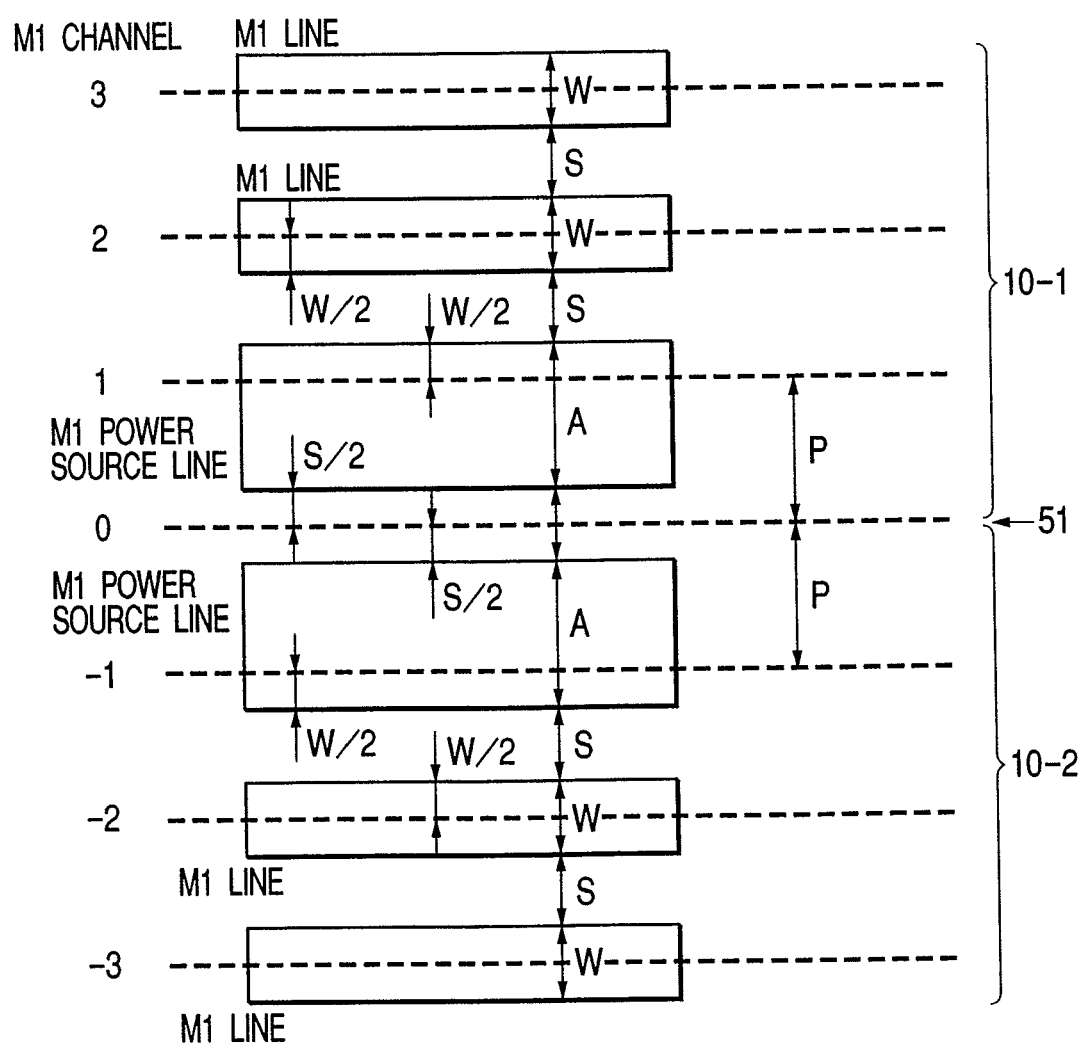
FIG. 15 is diagrammatic plan view showing a specific example of wiring when the first cells are used.

FIG. 15 shows a case in which the cells 10-1 and 10-2 are arranged close to each other in the vertical direction. Numeral 51 indicates the boundary between the cells 10-1 and 10-2. In the cell 10-1, the M1 channels are indicated by numerals 1, 2, 3 in order, moving away the cell boundary 51. In the cell 10-2, numerals −1, −2, −3 are indicated in order, moving away from the cell boundary 51. Here, to the cell boundary 51, "0" is allocated as the M1 channel for the sake of convenience. The interval of the M1 channels is defined as the sum of the minimum space S and the minimum interval W of M1 (first layer metal line), and the sum is indicated by "P".

Here, when the semiconductor integrated circuit is configured to be used from the channel 2 in the upper-side cell 10-1 and from the channel −2 in the lower-side cell 10-2, the M1 channels in the cells 10-1, 10-2 can be effectively used.

Accordingly, to allow the M1 power source lines to be laid out at positions that are spaced away from the boundary 51 between cells which are arranged close to each other in the above-mentioned manner, the power source lines in the peripheral portions of the cells 10-1, 10-2 are laid out so as to be spaced away from the peripheries of the cells, and these cells are used in the layout of the semiconductor integrated circuit. Further, the respective M1 power source lines of the cells that are arranged close to each other are configured such that the line widths assume the maximum values within a range of the given wiring rule.

The width of the M1 power source line is expressed by the following equation.

$$A = 2 \times (W+S) - W/2 - S - S/2 = 3W/2 + S/2$$

For example, when the minimum interval W and the minimum space S are set such that W=0.2 μm, S=0.2 μm, the width of the M1 power source line becomes 0.4 μm as expressed by the following equation.

$$A = 3 \times (0.2/2) + 0.2/2 = 0.4$$

In this case, the ratio between the minimum line width (W) of the M1 line and the M1 power source line width (A) is set to 1:2.

Now, a second cell, which is used in the layout of the above-mentioned semiconductor integrated circuit, will be explained.

Figure 9:
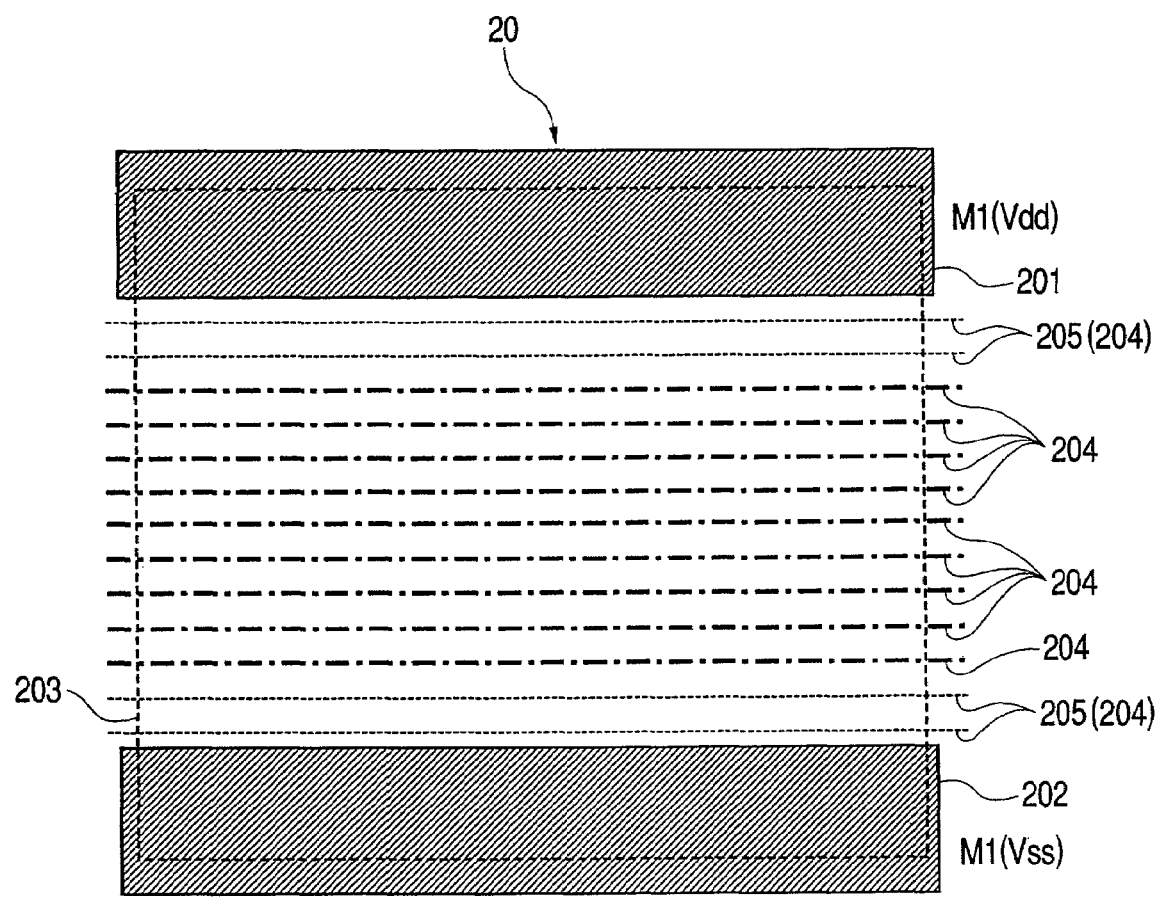
FIG. 9 is a diagrammatic plan view showing an example of the main constitution of a second cell used in a layout of the semiconductor integrated circuit according to the present invention.

FIG. 9 shows an example of the constitution of the second cell used in the layout of the semiconductor integrated circuit.

The size of the second cell 20 (hereinafter simply referred to as "cell 20") is determined on the basis of a quadrangular frame 203. In the drawing, numeral 201 indicates a high-potential-side (Vdd) power source line; numeral 202 indicates a low-potential-side (Vss) power source line; and 204 indicates channel positions which can be used in auto routing in the first metal line (M1) layers. The cell 20 is configured such that terminals are arranged on the usable channel positions 204 to enable connection by the auto routing after the auto placement of the cell 20 in the work station. When the cell 20 is placed in the work station, the lines are placed at the usable channel positions 204 and the terminals of the cell 10 are connected to the cell 20 by such wiring. Here, other wiring, which connects terminals of other cells, may pass over the channel position 204 of the cell 20.

The cell height in the vertical direction (the direction orthogonal to the extension direction of the power source wiring layers) of the cell 20 (the width in the vertical direction of the frame 203) is configured to be larger than the cell height in the vertical direction of the cell 10 (the width in the vertical direction of the frame 103), and the number of wiring channels (channel positions) 204 of the cell 20 is configured to be larger than the number of the wiring channels 104 of the cell 10.

The cell 20 includes the M1 power source line, which is arranged at a peripheral portion of the cell, and narrow-width lines, which have a narrower line width than the power source lines, wherein the line interval between the M1 power source line and the narrow-width line which is arranged close to the M1 power source line is set to be wider than the minimum arrangement pitch of the narrow-width lines. To be more specific, the width of the wide-width line, which is arranged at the peripheral portion of the cell, is set to be slightly wider, such that the wide-width line projects from the frame 203 of the cell 20 and assumes a value equivalent to a zone of width of the M1 power source line, which is combined by arranging a plurality of cells close to each other in the above-mentioned first step.

Although the circuit constitution or the like of the cell 20 is not particularly limited, the cell 20 is configured to have the same constitution as the above-mentioned first cell 10 (FIG. 4 to FIG. 8).

Figure 10:
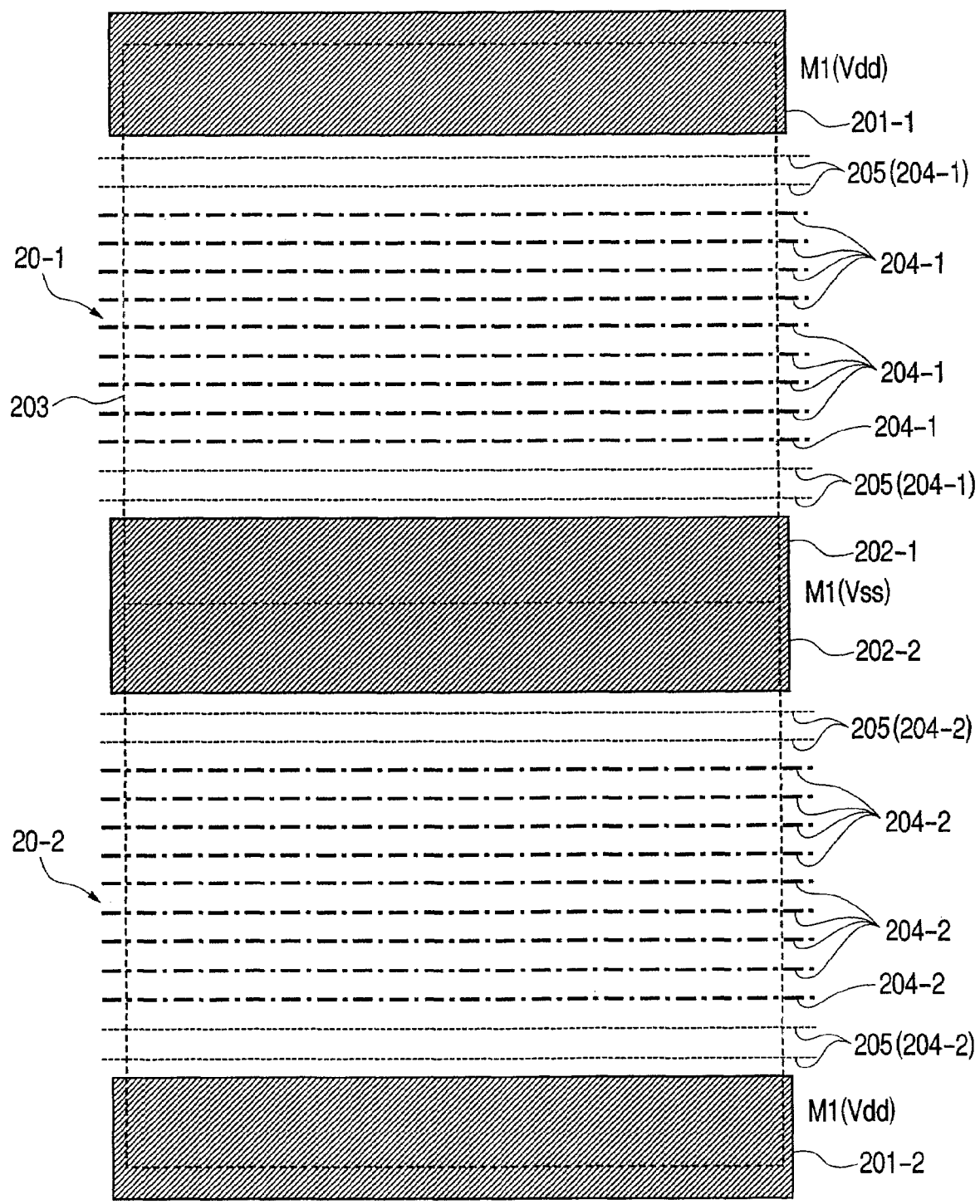
FIG. 10 is a diagrammatic plan view showing an arrangement of the second cells.

FIG. 10 shows a state in which cells 20-1, 20-2 are arranged close to each other in the vertical direction. The cells 20-1, 20-2 are constituted in the same manner as the cell 20 shown in FIG. 9.

By arranging the cells 20-1, 20-2 close to each other in the vertical direction, the M1 power source line 202-1 of the cell 20-1 and the M1 power source line 202-2 of the cell 20-2, which is arranged close to the cell 20-1 in the vertical direction, are combined or joined whereby the width of the M1 power source line becomes twice as large as the width of the M1 power source line in the cell 20. Corresponding to the width of the combined power source line, the interval between the combined power source line and the narrow-width line, which is arranged close to the combined power source line, is set to be larger than the minimum arrangement pitch of the narrow-width lines (the arrangement pitch between the wiring channels 204-1, 204-2). That is, in the cell 20, the width of the large-width line, which is formed on the peripheral portion of the cell, is projected from the frame 203 of the cell 20 to assume a slightly wider value equivalent to the zone of the width of the combined M1 power source lines, by arranging a plurality of cells close to each other in the above-mentioned first step. Accordingly, out of the wiring channels 204-1, 204-2 which are arranged close to the M1 power source line 201, the wiring channel indicated by numeral 205 cannot be used as wiring at the stage of the cell 20, whereby the interval between the M1 power source lines 201, 202 and the narrow-width lines arranged close to the M1 power source lines 201, 202 is set to be wider than a minimum arrangement pitch of the narrow-width line. In such cells 201, 202, by setting the interval between the M1 power source line and the narrow-width line, which is arranged close to the M1 power source line in the vertical direction, so that it is larger than the minimum arrangement pitch between the narrow-width lines, it is possible to ensure the interval between the M1 power source line and the narrow-width line, which are arranged close to each other in the vertical direction, at the stage of cells, such that the interval conforms to the wiring rule when the semiconductor integrated circuit is laid out.

For example, in accordance with the prior arrangement, in a case in which the design rule is set such that the wider the width of the line, the wider will be the line interval between a line and another line which is arranged close to the line in the vertical direction, although at the time of laying out the single cell, the design rule is satisfied, at the time of laying out a semiconductor integrated circuit using the cells, the power source lines in the cells arranged close to each other are combined with each other, so that the line width of the power source line is widened; whereby, even when the zone of the line width is increased due to the broadening of the line width of the power source line, the interval between the lines in the cell is fixed, and, hence, there is a possibility that the design rule is not satisfied.

On the other hand, according to the layout using the above-mentioned cells 20-1, 20-2, in the cell 20, the width of the large-width line, which is formed on the peripheral portion of the cell, is projected from the frame 203 of the cell 20 to assume a slightly wider value equivalent to the zone of the width of the combined M1 power source lines by arranging a plurality of cells in the vertical direction close to each other in the above-mentioned first step. Accordingly, the use of the wiring channel 205, which is arranged close to the M1 power source line 201, is prohibited as the wiring in the stage of the cell 20. Accordingly, the interval between the M1 power source lines 201, 202 and the narrow-width lines arranged close to the M1 power source lines 201, 202 in the vertical direction is set to be wider than a minimum arrangement pitch of the narrow-width lines. In such cells 201, 202, by setting the interval between the M1 power source line and the narrow-width line, which is arranged close to the M1 power source line in the vertical direction, so that it is larger than the minimum arrangement pitch between the narrow-width lines, it is possible to ensure the interval between the M1 power source line and the narrow-width line, which are arranged close to each other in the vertical direction, such that the interval conforms to the wiring rule when the semiconductor integrated circuit is laid out, whereby a design rule violation which is revealed for the first time in the layout of the semi-conductor integrated circuit can be obviated at the time of forming the second cell in advance.

That is, it is possible to reduce the resistance values of the M1 power source lines 201, 202; and, at the same time, it is possible to ensure the number of wiring channels 204 of the cell 20 and to make effective use of these wiring channels 204. Further, it is possible to obviate a design rule violation, and an increase of the design time incurred by a design rule violation can be obviated at the time of forming the cell 20 in advance.

Figure 11:
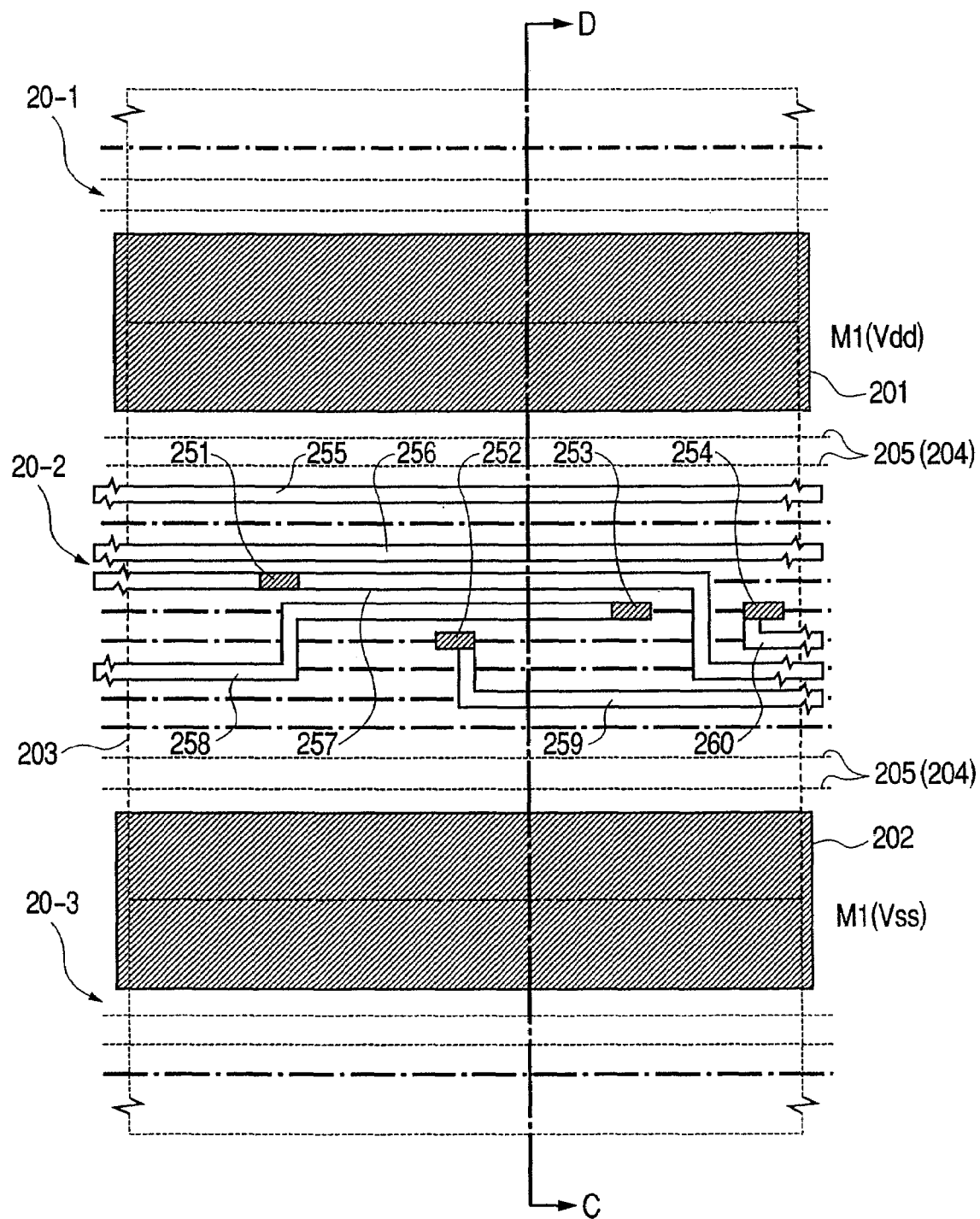
FIG. 11 is a diagrammatic plan view showing an example of the constitution of the second cell.
Figure 12:
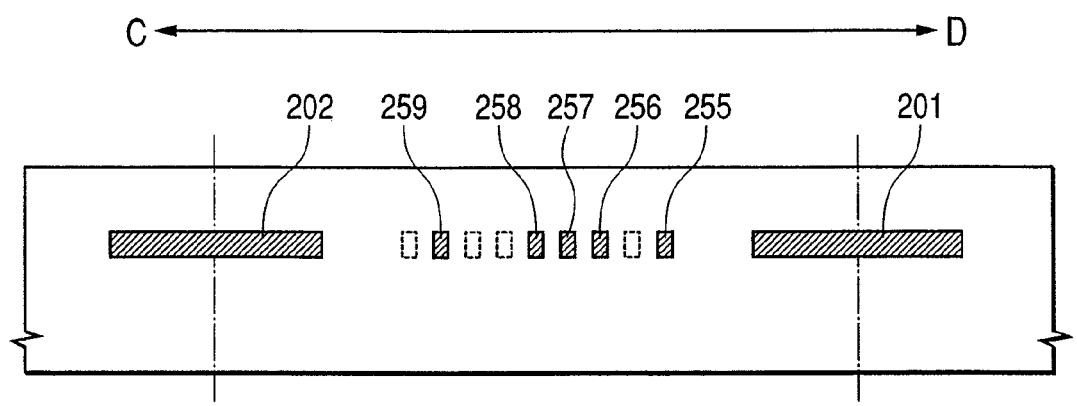
FIG. 12 is a cross-sectional view as seen along line C-D in FIG. 11.

FIG. 11 shows the arrangement of M1 terminal layers in the cell 20-2, M1 wiring layers which are connected to these terminals, and the M1 lines which pass above the cell when the cells 20-1, 20-2, 20-3 are arranged close to each other in the vertical direction, and a cross section taken along a line C-D in FIG. 11 is shown in FIG. 12.

Numerals 251 to 254 indicate the M1 terminal layers, and numerals 255, 256 indicate the M1 wiring layers which pass above the cell, wherein these layers are all formed on the wiring channels. Here, since the cells 20-1, 20-3 are also constituted in the same manner, their constitutions are omitted from FIG. 12.

Here, a specific example of the line widths in the above-mentioned cell 20 will be explained in conjunction with FIG. 16 and FIG. 17.

Figure 16:
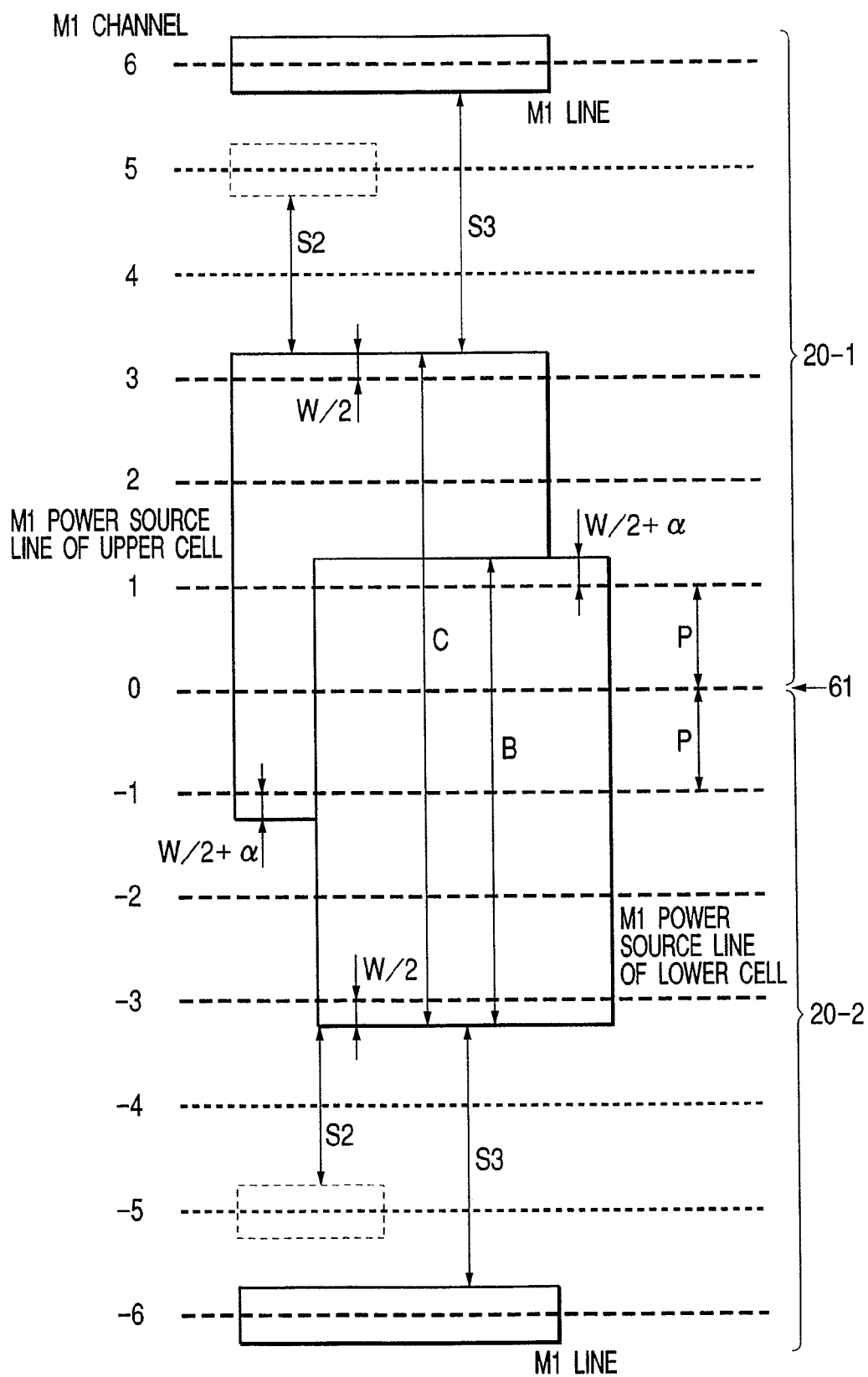
FIG. 16 is a diagrammatic plan view showing a specific example of wiring when the second cells are used.

FIG. 16 shows a case in which the cells 20-1, 20-2 are arranged close to each other in the vertical direction. Numeral 61 indicates a boundary between the cells 20-1, 20-2. In the cell 20-1, the M1 channels are indicated by numerals 1, 2, 3, 4, 5, 6 in order, moving away from the cell boundary 61. In the cell 20-2, the M1 channels are indicated by numerals −1, −2, −3, −4, −5, −6 in order, moving away from the cell boundary 61. Here, "0" is allocated to the cell boundary 61 as the M1 channel for the sake of convenience.

In the drawing, the M1 channels are indicated by numerals. The interval of M1 channels is defined as the sum of the minimum space S and the minimum interval W of M1 and is expressed as "P". Further, in FIG. 17, the relationship between the line space and the applicable line width is shown.

Here, the width of the M1 power source line is set such that the allowable channels out of the M1 channels in the cell assume a state similar to a state at the time of the chip placement. The width of the M1 power source lines in the cells 20-1, 20-2 is expressed by the following equation.

$$B = 4 \times P + W/2 + W/2 + W = 4P + W + \alpha$$

On the other hand, the width of the M1 power source lines at the time of chip placement is expressed by the following equation.

$$C = 6 \times P + W/2 + W/2 = 6P + W$$

The width of the M1 power source lines at the time of chip placement is expressed as C=6P+W, and, hence, the required space defined based on the width of the M1 power source lines of the chip becomes S3 from FIG. 17.

On the other hand, the width of the M1 power source lines in the cell is expressed as B=4P+W when $\alpha$ is expressed as $\alpha=0$, and, hence, the required space defined by the width of the M1 power source line in the cell assumes the value S2 from FIG. 17.

Accordingly, to realize a power source line width which demands the required space corresponding to the chip power source line width at the time of completion of the cell, it is necessary to set $\alpha$ to $\alpha>0$, for example, $\alpha=0.01$.

Figure 13:
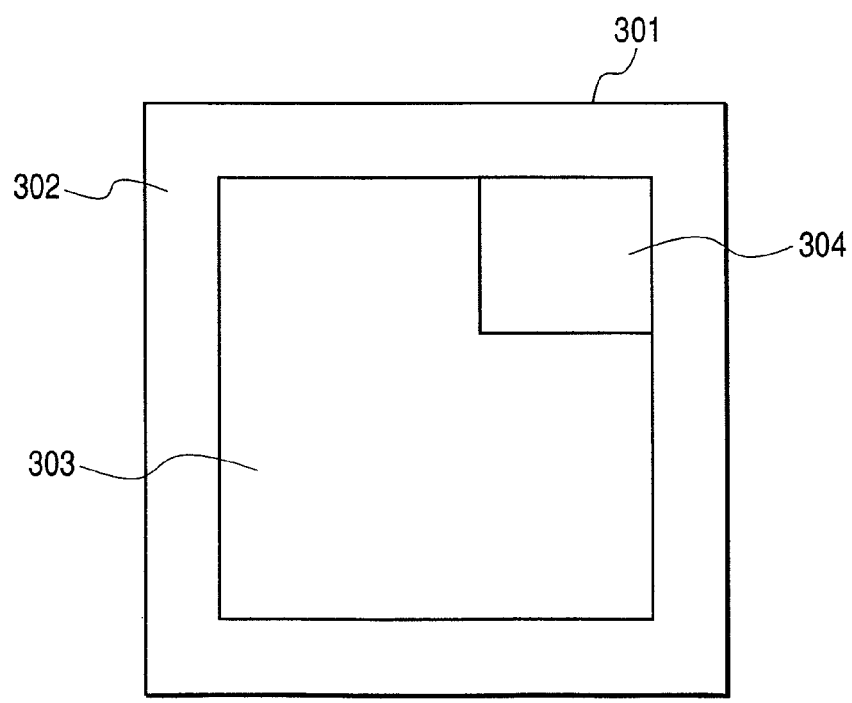
FIG. 13 is a diagrammatic plan view of a semiconductor integrated circuit including first cells and second cells.

FIG. 13 shows a semiconductor integrated circuit which is formed by using the above-mentioned cell 10 and the above-mentioned cell 20.

In the semiconductor integrated circuit (chip) 301, a mask pattern is formed based on information which is produced in accordance with a layout using the cell 10 and the cell 20, and the semiconductor integrated circuit 301 is formed by using this mask pattern. Here, although the invention is not particularly limited, the wiring of the semiconductor integrated circuit is performed by the damascene method. That is, groove working is applied to an insulation film; copper which constitutes a wiring material is embedded in the grooves by a method such as plating; and, thereafter, an extra copper thin film, which is disposed outside the grooves, is removed by chemical mechanical polishing (CMP).

Although the invention is not particularly limited, the semiconductor integrated circuit 301 includes an input/output circuit region 302, a first region 303 and a second region 304. In the input/output circuit region 302, there is a circuit which allows inputting/outputting of signals between the semiconductor integrated circuit 303 and the outside. The first region 303 is constituted by using the first cells 10 shown in FIG. 1, while the second region 304 is constituted of the second cells 20 shown in FIG. 9.

Although the invention is not particularly limited, the input/output circuit formed in the input/output circuit region 302 is constituted of the cells 10 and the cells 20.

That is, the gate width of the MOS transistor which constitutes the cell 20 is configured to be larger than the gate width of the MOS transistor which constitutes the cell 10. Accordingly, the cell height in the vertical direction (direction orthogonal to the extension direction of the power source wiring layers) of the cell 20 (the width in the vertical direction of the frame 203) is configured to be larger than the cell height in the vertical direction of the cell 10 (width in the vertical direction of the frame 103) so that the number of wiring channels (channel positions) 204 of the cell 20 is set to be larger than the number of the wiring channels 104 of the cell 10. Further, although the invention is not particularly limited, the operating voltage (Vdd1) of the MOS transistor which constitutes the cell 20 is set higher than the operating voltage (Vdd2) of the MOS transistor which constitutes the cell 10, while the film thickness of the gate insulation film of the MOS transistor which constitutes the cell 20 may be set to be larger than the film thickness of the gate insulation film of the MOS transistor which constitutes the cell 10.

Here, the gate width, the cell height and the number of wiring channels of the MOS transistor of the cell 20 that is used in the input/output circuit region 302 may be configured to differ from the gate width, the cell height and the number of wiring channels of the MOS transistor of the cell 20 that is used in the second region 304. Further, the gate width, the cell height and the number of wiring channels of the MOS transistor of the cell 10 that is used in the input/output circuit region 302 may be configured to differ from the gate width, the cell height and the number of wiring channels of the MOS transistor of the cell 10 that is used in the first region 303.

Due to such a constitution, the resistance values of the M1 power source lines 201, 202 of the cell 20 can be reduced; and, at the same time, it is possible to ensure the number of wiring channels 204 of the cells 10, 20 and to make effective use of the wiring channels 204, whereby the integration of the semiconductor integrated circuit 301 can be enhanced. Further, the period necessary for the series of steps from the designing to the manufacturing of the semiconductor integrated circuit 301 can be shortened.

In this manner, in the semiconductor integrated circuit shown in FIG. 13, the first region and the second region, which differs from the first region, are formed on one semiconductor substrate. In the first region, a plurality of first cells, which have respective functions, are arranged in the first direction and in the second direction, which is orthogonal to the first direction, wherein the power source lines are arranged such that they extend in the first direction on the peripheral portion of the first cell, and the power source lines on the peripheral portion of the first cell are laid out at positions that are spaced away from the boundary between the first cell and another cell which is arranged close to the cell in the second direction. Further, in the second region, a plurality of second cells, which have respective functions, are arranged in the third direction (for example, one of the above-mentioned first direction and the above-mentioned second direction) and the in the fourth direction, which is orthogonal to the third direction, wherein the power source lines are arranged such that they extend in the third direction on the peripheral portion of the second cell, and the power source lines on the peripheral portion of the second cell are integrally formed with the power source lines of another second cell, which is arranged close to the second cell in the fourth direction.

Further, the above-mentioned second cell includes a wide-width line that constitutes the power source line, which is arranged at the peripheral portion of the second cell and extends in the third direction, and narrow-width lines, which are arranged to extend in the third direction and have a narrower line width than the wide-width line.

Further, the power source lines and the narrow-width lines of the first and second cells are formed by embedding conductive films into grooves formed in the insulation film.

Figure 14:
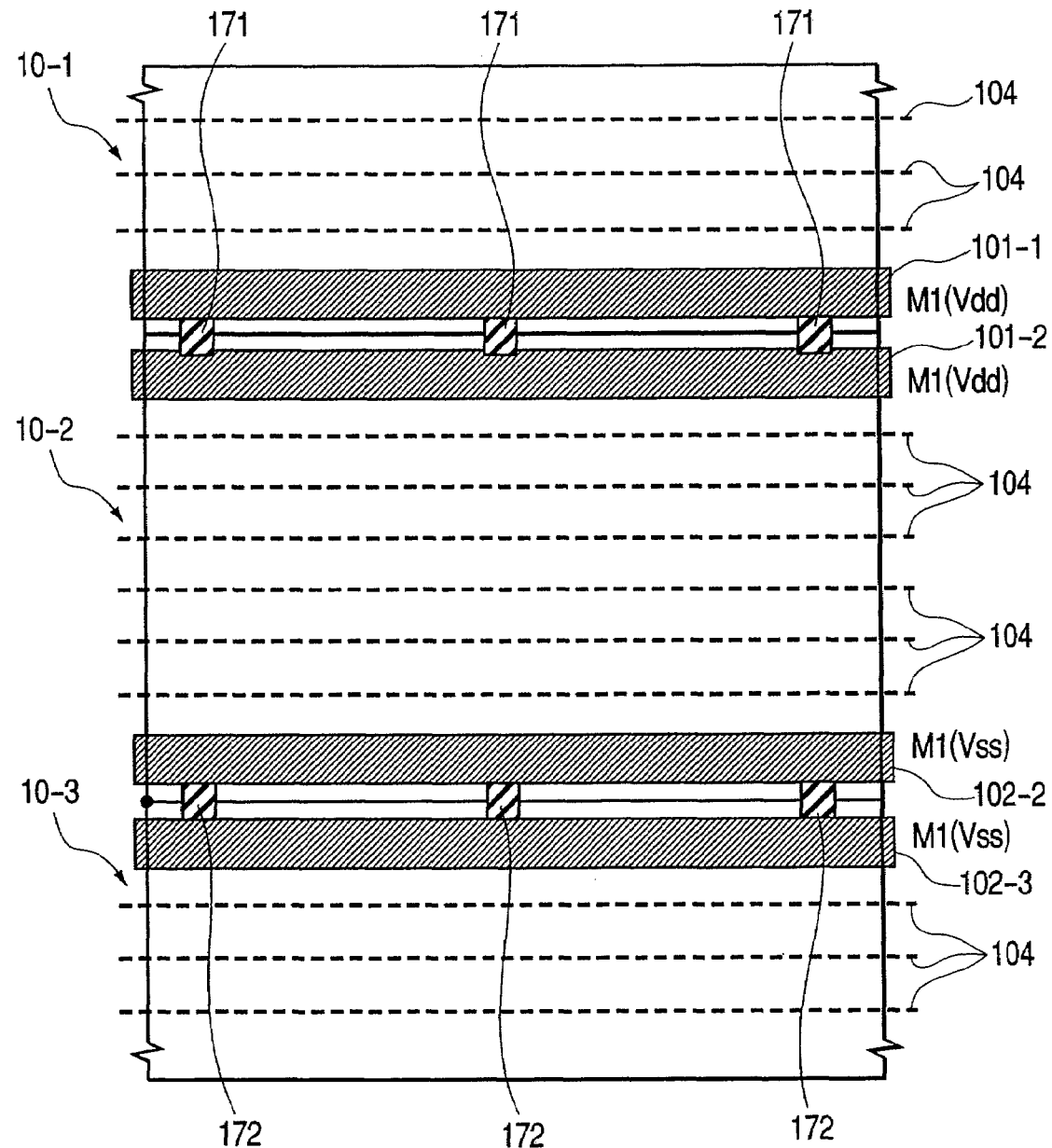
FIG. 14 is diagrammatic plan view showing a modification of the first cell.

FIG. 14 shows a modification of the first cell 10 used in the layout of the semiconductor integrated circuit shown in FIG. 1 and FIG. 13.

As shown in FIG. 14, with respect to the first cell 10 shown in FIG. 1 and FIG. 13, between the power source line of the first cell 10 and the power source line of another first cell 10, which is arranged close to the first cell 10 in the vertical direction (the direction orthogonal to the extending direction of the power source wiring layers), bridging portions which are capable of bridging power supply lines may be formed. To be more specific, as shown in FIG. 14, in the first cells 10-1, 10-2 which are arranged close to each other, bridging portions 171 are formed so as to bridge (integrally formed) the neighboring power source lines 101-1, 101-2, while in the first cells 10-2, 10-3, which are arranged close to each other, the bridging portions 172 bridge (integrally form) the neighboring power source lines 102-2, 102-3 for every given interval. Although the invention is not particularly limited, the bridging portions 171, 172 may be formed by making use of the M1 wiring layers. That is, at the time of forming the wiring grooves 101-1, 101-2, 102-2, 102-3, grooves are also formed in the bridging portions 171, 172 simultaneously, and conductive films are embedded into the wiring grooves 101-1, 101-2, 102-2, 102-3 and the grooves formed in the bridging portions 171, 172 by CMP, whereby it is possible to form the bridging portions 171, 172 as well as the power source lines 101-1, 101-2, 102-2, 102-3 using the same steps. Accordingly, the wiring grooves 101-1, 101-2 and the bridging portions 171 are integrally embedded with the conductive film, while the wiring grooves 102-2, 102-3 and the bridging portions 172 are also integrally embedded with the conductive film.

With the provision of these bridging portions 171, 172, compared to the case in which the Vdd power source lines 101-1, 101-2 and the Vss power source lines 102-1, 102-3 are respectively present in a single form (the case in which the bridging portions 172 are not present), the allowable current value can be increased in the power source lines. That is, by making use of the phenomenon that the probability that the arranged cells are operated simultaneously is not 100%, when one cell is not operated, the power source line of the cell is operated as if the power source line is that of another cell, which is disposed close to the cell, whereby the allowable electric current value can be effectively increased.

Further, although the power source lines are constituted of the wide-width lines in the above-mentioned example, the wide-width lines may be lines other than the power source lines.

In this manner, the power source lines of the first cells 10 which are arranged close to each other in the vertical direction (the second direction) in FIG. 1 and FIG. 13 include bridging portions which bridge the power source lines.

According to the above-mentioned embodiment, the following advantageous effects can be obtained.

(1) When the first cells 10-1, 10-2, 10-3 are used, since the M1 power source lines are laid out to be spaced away from the boundaries of the cells, in laying out the semiconductor integrated circuit, the power source lines are not combined among the cells 10-1, 10-2, 10-3. As a result, the width of the power source lines is not changed. Accordingly, it is possible to satisfy the design rule with respect to the interval between a line and another line arranged close to the line, corresponding to the line width of the line, and, hence, it is possible to prevent the reduction of the number of wiring channels. Accordingly, the supply rate of the wiring channels can be enhanced, and, further, the integration of the semiconductor chip can be enhanced.

(2) According to the layout using the cells 20-1, 20-2, in the cell 20, by setting the width of the wide-width line arranged at the peripheral portion of the cell such that the width is slightly widened so as to project from the frame 203 of the cell 20, whereby the width assumes a value equivalent to the zone of the width of the combined M1 power source line, which is formed by arranging a plurality of cells close to each other in the first step, the wiring channel 205 which is arranged close to the M1 power source line 201 is prevented from being used as the line at the stage of cell 20; and, hence, the interval between the M1 power source lines 201, 202 and the narrow-width lines arranged close to the M1 power source lines 201, 202 can be set to be wider than the minimum arrangement pitch of the narrow-width lines. In this manner, since the interval between the M1 power source lines and the narrow-width lines that are arranged close to the M1 power source lines 201, 202 can be set to be wider than the minimum arrangement pitch of the narrow-width lines, it is possible to make the interval between the M1 power source lines and the narrow-width lines, which are arranged close to the M1 power source lines, conform to the wiring rule when the layout is made with respect to the semiconductor integrated circuit at the stage of cells, whereby the design rule violation which is revealed for the first time in the layout of the semiconductor integrated circuit can be obviated at the time of forming the second cell in advance.

(3) By taking the manner of operation and the advantageous effects described in the above-mentioned paragraphs (1) and (2) into consideration, it is possible to use either the first cell 10 or the second cell 20 in response to the ratio between the width of the narrow-width lines (signal lines) and the wide-width lines (power source lines). For example, when the ratio between the width of the narrow-width lines (signal lines) and the wide-width lines (power source lines) is less than 1:2, a priority is assigned to the enhancement of the supply rate of the wiring channels, so that the layout using the first cell 10 is adopted; while, when the ratio between the width of the narrow-width lines (signal lines) and the wide-width lines (power source lines) is equal to or more than 1:2, a priority is assigned to obviate the design rule violation, so that the layout using the second cell 20 is adopted.

Although the invention has been explained specifically heretofore, it is needless to say that the present invention is not limited to such specific constitutions, and various modifications can be made without departing from the gist of the present invention.

In the above-mentioned description, although the invention has been explained with respect to a semiconductor integrated circuit on which the wiring is formed using the damascene method, which constitutes the application field of the present invention, the present invention is not limited to such a semiconductor integrated circuit.

The present invention is applicable provided that at least the cells are used.

To briefly recapitulate the advantageous effects obtained by typical aspects of the invention disclosed in this specification, examples thereof are as follows.

That is, since it is possible to lay out the lines on the peripheral portions of the cells at positions spaced away from the boundaries of the cells which are arranged close to each other, the phenomenon that the line width is widened due to the combination of the wide-width lines in the cells which are arranged close to each other, for example, can be obviated. When the line width is widened due to the combination of the wide-width lines in the cells which are arranged close to each other, the lines in the peripheral portion and the wiring channels which are arranged close to the lines in the peripheral portion violate the design rule on line interval, and, hence, they cannot be used as auto routing channels. On the contrary, by laying out the lines in the peripheral portions of the cells at positions spaced away from the boundaries of the cells which are arranged close to each other, it is possible to prevent the line width of the wide-width lines from being widened; and, hence, the phenomenon that the lines in the peripheral portions and the wiring channels arranged close to the lines in the peripheral portions cannot be used as auto routing channels due to the violation of the line interval rule can be obviated, whereby the wiring channels can be effectively used.

Further, the width of the power source line formed in the peripheral portion of the cell is preliminarily set to be wider such that the width of the power source line assumes a value equivalent to the zone of the width of the power source line which is formed by combination when a plurality of cells are arranged close to each other in the first step. According to the layout adopting such cells, by setting the width of the wide-width line formed in the peripheral portion of the cell to be wider, such that the width of the wide-width line assumes a value equivalent to the zone of the width of the power source line which is formed by combination when a plurality of cells are arranged close to each other in the first step, the wiring channels which are arranged close to the power source line are prohibited from being used as the line at the stage of the cell, whereby the interval between the power source line and the narrow-width line, which is arranged close to the power source line, can be set to be wider than the minimum arrangement pitch of the narrow-width lines. Since the interval between the power source line and the narrow-width line which is arranged close to the power source line can be set to be wider than the minimum arrangement pitch of the narrow-width line, it is possible to ensure the interval between the power source line and the narrow-width line, which are arranged close to each other, at the state of the cell, such that the interval conforms to the wiring rule when the wiring is laid out in the semiconductor integrated circuit, whereby the design rule violation which is revealed for the first time in the layout of the semiconductor integrated circuit can be obviated at the time of forming the cells.

Effects of typical features of the invention disclosed in this specification are as follows.

Effective use of wiring channels of wiring is realized.

A design rule error is prevented at the time of forming cells.

The invention claimed is:

1. A semiconductor integrated circuit which is formed on one semiconductor substrate in a form so that the semiconductor integrated circuit includes a first region and a second region, which is different from the first region, wherein a plurality of first cells having respectively given functions are arranged in the first region, lines which are arranged on peripheral portions of a first cell are laid out at positions away from boundaries of the first cells which are arranged close to each other, and wherein a plurality of second cells having respectively given functions are arranged in the second region, a second cell includes wide-width lines arranged on the peripheral portion thereof and narrow-width lines having a line width narrower than the line width of the wide-width lines in the second cell, and the line interval between a wide-width line and a narrow-width line, which is arranged close to the wide-width line, is set to be wider than the minimum arrangement pitch of the narrow-width lines.

2. A semiconductor integrated circuit according to claim 1, wherein the line interval between a wide-width line and a narrow-width line that is arranged close to the wide-width line is formed by omitting the wiring formation on the minimum arrangement pitch of the narrow-width lines.

3. A semiconductor integrated circuit according to claim 1, wherein the line on the peripheral portion in the first cell is laid out at a position spaced away, by a minimum arrangement pitch of the narrow-width lines, from the boundary between first cells which are arranged close to each other.

4. A semiconductor integrated circuit according to claim 1, wherein a first cell includes bridging portions which are capable of bridging the wide-width line of one first cell and the wide-width line of another first cell arranged close to the one first cell.

5. A semiconductor integrated circuit device according to claim 1, wherein the lines are formed by embedding a conductive film into grooves formed in an insulating film.

6. A semiconductor integrated circuit device according to claim 5, wherein the conductive film is comprised of copper.

7. A semiconductor integrated circuit device according to claim 1, wherein the lines are comprised of copper.

* * * * *